United States Patent
Matsuzaki et al.

(10) Patent No.: US 8,467,232 B2
(45) Date of Patent: Jun. 18, 2013

(54) SEMICONDUCTOR DEVICE

(75) Inventors: Takanori Matsuzaki, Kanagawa (JP); Kiyoshi Kato, Kanagawa (JP); Shuhei Nagatsuka, Kanagawa (JP); Hiroki Inoue, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 145 days.

(21) Appl. No.: 13/193,966

(22) Filed: Jul. 29, 2011

(65) Prior Publication Data

US 2012/0033485 A1    Feb. 9, 2012

(30) Foreign Application Priority Data

Aug. 6, 2010   (JP) ................................. 2010-176959

(51) Int. Cl.
*G11C 11/24*        (2006.01)

(52) U.S. Cl.
USPC ........................................................ 365/149

(58) Field of Classification Search
None
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,972,986 B2 | 12/2005 | Peng et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,064,973 B2 | 6/2006 | Peng et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |

(Continued)

FOREIGN PATENT DOCUMENTS

| | | |
|---|---|---|
| EP | 1 583 239 A2 | 10/2005 |
| EP | 1 737 044 A1 | 12/2006 |

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Hoai V Ho
*Assistant Examiner* — James G Norman
(74) *Attorney, Agent, or Firm* — Fish & Richardson P.C.

(57) ABSTRACT

In a semiconductor device which includes a bit line, m (m is a natural number of 3 or more) word lines, a source line, m signal lines, first to m-th memory cells, and a driver circuit, the memory cell includes a first transistor and a second transistor for storing electrical charge accumulated in a capacitor, and the second transistor includes a channel formed in an oxide semiconductor layer. In the semiconductor device, the driver circuit generates a signal to be output to a (j−1)th (j is a natural number of 3 or more) signal line with the use of a signal to be output to a j-th signal line.

11 Claims, 20 Drawing Sheets

U.S. PATENT DOCUMENTS

| | | |
|---|---|---|
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0227062 A1 | 9/2011 | Kato et al. |
| 2011/0317474 A1 | 12/2011 | Kato |
| 2012/0014157 A1 | 1/2012 | Kato et al. |

FOREIGN PATENT DOCUMENTS

| | | | |
|---|---|---|---|
| EP | 2 226 847 A2 | | 9/2010 |
| JP | 57-105889 A | | 7/1982 |
| JP | 60-198861 A | | 10/1985 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 05-251705 A | | 9/1993 |
| JP | 08-264794 A | | 10/1996 |
| JP | 11-505377 A | | 5/1999 |
| JP | 2000-044236 A | | 2/2000 |
| JP | 2000-150900 A | | 5/2000 |
| JP | 2001-053167 A | | 2/2001 |
| JP | 2001053167 | * | 2/2001 |
| JP | 2002-076356 A | | 3/2002 |
| JP | 2002-289859 A | | 10/2002 |
| JP | 2003-086000 A | | 3/2003 |
| JP | 2003-086808 A | | 3/2003 |
| JP | 2004-103957 A | | 4/2004 |
| JP | 2004-273614 A | | 9/2004 |
| JP | 2004-273732 A | | 9/2004 |
| WO | 2004/114391 A1 | | 12/2004 |

OTHER PUBLICATIONS

Kim, W et al., "An Experimental High-Density DRAM Cell with a Built-in Gain Stage," IEEE Journal of Solid State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al.. "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al.. "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel, YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle C, "Hydrogen as a Cause of Doping in Zinc Oxide," Phys. Rev. Lett. (Physical Review Letters), Jul. 31, 2000, vol. 85, No. 5, pp. 1012-1015.

European Search Report, European Application No. 11176565.7, dated Oct. 27, 2011, 4 pages.

* cited by examiner

FIG. 3

| | | Written in k-th row: k-th row, first column "1"; k-th row, second to n-th columns "0" | Read from k-th row: k-th row, first column "1"; k-th row, second to n-th columns "0" |
|---|---|---|---|
| S_1~S_k | V4<br>0V | ⎴ | |
| S_(k+1)~S_m | V4<br>0V | | |
| BL_1 | V2<br>V1<br>0V | ⎴ | ⎴ |
| BL_2~BL_n | V2<br>V1<br>0V | ⎴ | ⎴ |
| WL_1~WL_(k-1) | V5<br>V0 | | ⎴ |
| WL_k | V5<br>V0 | | |
| WL_(k+1)~WL_m | V5<br>V0 | | ⎴ |
| G_1 | V3<br>0V | | ⎴ |
| G_2 | V3<br>0V | ⎴ | ⎴ |

FIG. 16A
FIG. 16B
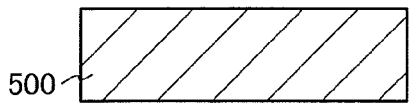
FIG. 16C
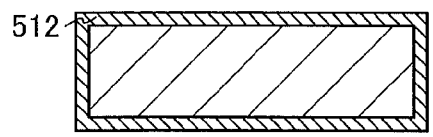
FIG. 16D
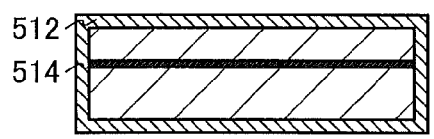
FIG. 16E
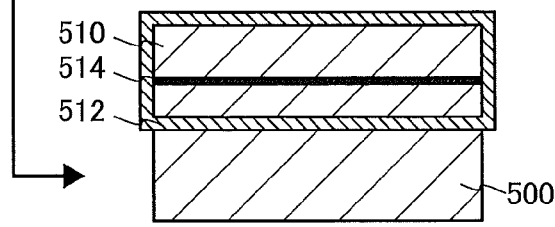
FIG. 16F  FIG. 16G
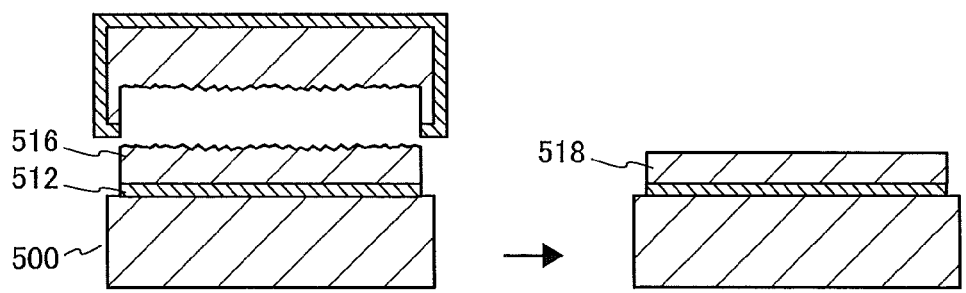

SEMICONDUCTOR DEVICE

BACKGROUND OF THE INVENTION

1. Field of the Invention

The disclosed invention relates to semiconductor devices including semiconductor elements and methods for driving the semiconductor devices.

2. Description of the Related Art

Memory devices including semiconductor elements are broadly classified into two categories: volatile memory devices that lose stored data when power is not supplied, and non-volatile memory devices that retains stored data even when power is not supplied.

A typical example of a volatile memory device is a DRAM (dynamic random access memory). A DRAM stores data in such a manner that a transistor included in a memory element is selected and electrical charge is accumulated in a capacitor.

When data is read from a DRAM, electrical charge in a capacitor is lost according to the principle; thus, another writing operation is necessary every time data is read. Further, a transistor included in a memory element has leakage current (off-state current) between a source and a drain in an off state or the like and electrical charge flows into or out even if the transistor is not selected, so that a data retention period is short. For that reason, another writing operation (refresh operation) is necessary at predetermined intervals, and it is difficult to sufficiently reduce power consumption. Furthermore, since stored data is lost when power is not supplied, a different memory device using a magnetic material or an optical material is needed in order to retain data for a long time.

A different example of a volatile memory device is an SRAM (static random access memory). An SRAM retains stored data by using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power is not supplied.

A typical example of a non-volatile memory device is a flash memory. A flash memory includes a floating gate between a gate electrode and a channel formation region in a transistor and stores data by holding electrical charge in the floating gate. Thus, a flash memory has advantages in that a data retention period is extremely long (semi-permanent) and refresh operation which is necessary in a volatile memory device is not needed (for example, see Reference 1).

However, there is a problem in that a memory element does not function after a predetermined number of writing operations because a gate insulating layer included in the memory element deteriorates due to tunneling current generated in writing operations. In order to reduce adverse effects of this problem, a method by which the number of writing operations is equalized among memory elements is employed, for example. However, complex peripheral circuit is needed to realize this method. Further, even when such a method is employed, the fundamental problem of lifetime cannot be solved. That is, a flash memory is not suitable for applications in which data is frequently rewritten.

In addition, high voltage is necessary in order to inject electrical charge into a floating gate or to remove the electrical charge, and a circuit for generating high voltage is required. Further, it takes a comparatively long time to inject or remove electrical charge, and it is not easy to increase the speed of writing or erasing data.

REFERENCE

Reference 1:Japanese Published Patent Application No. 57-105889

SUMMARY OF THE INVENTION

In view of the problems, an object of one embodiment of the disclosed invention is to provide a semiconductor device with a novel structure in which stored data can be retained even when power is not supplied, and does not have a limitation on the number of writing. An object of one embodiment of the disclosed invention is to provide a highly-integrated semiconductor device with a novel structure in which storage capacity per unit area is increased.

An object of one embodiment of the disclosed invention is to provide a semiconductor device with a novel structure in which an increase in the number of circuit elements due to higher integration can be suppressed and power can be reduced by the decrease in the number of elements.

One embodiment of the present invention is a semiconductor device which includes a bit line, m (m is a natural number of 3 or more) word lines, a source line, m signal lines, first to m-th memory cells, and a driver circuit. The first to m-th memory cells each include a first transistor, a second transistor, and a capacitor. The first transistor includes a first gate terminal, a first source terminal, and a first drain terminal. The second transistor includes a second gate terminal, a second source terminal, and a second drain terminal. The second transistor includes an oxide semiconductor layer, and a channel of the second transistor is formed in the oxide semiconductor layer. The source line is electrically connected to the first source terminal in the m-th memory cell. A k-th (k is a natural number of 1 to m) signal line is electrically connected to the second gate terminal in the k-th memory cell. A k-th word line is electrically connected to a first terminal of the capacitor in the k-th memory cell. The second drain terminal in the j-th (j is a natural number of 3 to m) memory cell is electrically connected to the first gate terminal in the (j−1)th memory cell, the second source terminal in the (j−1)th memory cell, and a second terminal of the capacitor in the (j−1)th memory cell. The first gate terminal in the m-th memory cell, the second source terminal in the m-th memory cell, and a second terminal of the capacitor in the m-th memory cell are electrically connected to each other. The first drain terminal in the j-th memory cell is electrically connected to the first source terminal in the (j−1)th memory cell. The driver circuit includes m first circuits and (m−1) second circuits. A write control signal and m row address selection signals are input to the driver circuit. The (m−1) second circuits output "1" when at least one of the signals input is "1". The write control signal and a j-th row address selection signal are input to a j-th first circuit. An output from a (j−2)th first circuit and an output from a (j−1)th second circuit are input to a (j−2)th second circuit. The output from the (j−1)th second circuit is input to a (j−1)th signal line. An output from an m-th first circuit is input to an m-th signal line.

In one embodiment of the present invention, the driver circuit can further include one delay circuit. The output from the m-th first circuit can be input to the m-th signal line though the delay circuit.

In one embodiment of the present invention, the driver circuit can further include m delay circuits. The output from the (j−1)th second circuit can be input to the (j−1)th signal line through a (j−1)th delay circuit. The output from the m-th first circuit can be input to the m-th signal line though an m-th delay circuit.

The first transistor can include a channel formation region provided over a substrate including a semiconductor material, impurity regions provided so as to sandwich the channel formation region, a first gate insulating layer over the channel formation region, and a first gate electrode provided over the first gate insulating layer so as to overlap with the channel formation region.

A single crystal semiconductor substrate or an SOI substrate can be used as the substrate including a semiconductor material.

Silicon can be used as the semiconductor material.

The second transistor can include a second gate electrode provided so as to overlap with the oxide semiconductor layer and a second gate insulating layer provided between the oxide semiconductor layer and the second gate electrode.

The oxide semiconductor layer can include an oxide semiconductor material containing In, Ga, and Zn.

In the semiconductor device, the plurality of memory cells can be connected in series between the bit line and the source line.

In the semiconductor device, the transistor includes an oxide semiconductor in some cases; however, the disclosed invention is not limited to this. A material which has off-state current characteristics equivalent to those of the oxide semiconductor, for example, a wide-gap material such as silicon carbide (specifically, for example, a semiconductor material whose energy gap $E_g$ is more than 3 eV) may be used.

In addition, in this specification and the like, terms such as "electrode" and "wiring" do not limit the functions of components. For example, an "electrode" can be used as part of a "wiring", and the "wiring" can be used as part of the "electrode". The terms such as "electrode" and "wiring" can also mean a combination of a plurality of "electrodes" and "wirings", for example.

Functions of a "source" and a "drain" might interchange when a transistor of opposite polarity is used or the direction of current flow is changed in circuit operation, for example. Thus, in this specification, the terms "source" and "drain" can interchange.

Note that in this specification and the like, the term "electrically connected" includes the case where components are connected to each other through an object having any electric function. Here, there is no particular limitation on an object having any electric function as long as electric signals can be transmitted and received between components that are connected to each other through the object.

Examples of an "object having any electric function" are a switching element such as a transistor, a resistor, an inductor, a capacitor, and an element with a variety of functions in addition to an electrode and a wiring.

Since the off-state current of a transistor including an oxide semiconductor is extremely low, stored data can be retained for an extremely long time with the use of the transistor. In other words, refresh operation is not needed or the frequency of the refresh operation can be extremely decreased, which leads to a sufficient reduction in power consumption. Further, stored data can be retained for a long time even when power is not supplied (note that a potential is preferably fixed).

Further, a semiconductor device according to the disclosed invention does not need high voltage for writing data and does not have the problem of deterioration of elements. For example, unlike a conventional non-volatile memory, it is not necessary to inject and extract electrons into and from a floating gate; thus, the problem of deterioration of a gate insulating layer does not occur. In other words, the semiconductor device according to the disclosed invention does not have the limitation on the number of writing, which is a problem of a conventional non-volatile memory, and reliability thereof is markedly improved. Furthermore, data is written depending on the on and off of the transistor, so that high-speed operation can be easily realized.

Since a transistor including a material other than an oxide semiconductor can operate at sufficiently high speed, a semiconductor device can perform operation (e.g., data reading) at sufficiently high speed in combination of a transistor including an oxide semiconductor. Further, a transistor including a material other than an oxide semiconductor can favorably realize a variety of circuits (e.g., a logic circuit or a driver circuit) which need to operate at high speed.

A semiconductor device having a novel feature can be realized with provision of both the transistor including a material other than an oxide semiconductor (in a broader sense, a transistor capable of operating at sufficiently high speed) and the transistor including an oxide semiconductor (in a broader sense, a transistor whose off-state current is sufficiently low).

In the semiconductor device according to the disclosed invention, the transistors each including an oxide semiconductor in the memory cells of the semiconductor device are connected in series, so that a source electrode of the transistor including an oxide semiconductor in the memory cell and a drain electrode of the transistor including an oxide semiconductor in the adjacent memory cell can be connected to each other. In other words, in each memory cell, one of the source electrode and the drain electrode of the transistor including an oxide semiconductor does not need to be connected to a wiring through an opening. Thus, the area of the memory cells can be reduced, so that the semiconductor device can be highly integrated and storage capacity per unit area can be increased.

In the semiconductor device according to the disclosed invention, the second transistors (the transistors including oxide semiconductor materials) are electrically connected in series; thus, it is necessary to perform data writing sequentially from the memory cell that is most distant from the bit line (the m-th memory cell) to the memory cell that is closest to the bit line (the first memory cell). Thus, it is necessary that the second transistors to which data is written be turned on and all the second transistors connected between the memory cell to which data is written and the bit line be turned on. Here, the gate terminal of the second transistor is electrically connected to the signal line; thus, on and off of the second transistor are controlled with a signal input to the signal line.

The driver circuit for outputting a signal to the signal line has the above structure. That is, the driver circuit generates a signal to be output to the (j−1)th signal line with the use of a signal to be output to a j-th signal line. In this manner, a driver circuit with a simple structure can generate a signal with which all the second transistors connected between the j-th memory cell and the bit line (the second transistors in the first to (j−1)th memory cells) are turned on when the second transistor in the memory cell that is distant from the bit line (the j-th memory cell) is turned on.

With provision of the delay circuit in the driver circuit, a difference in timings of outputting signals to signal lines can be decreased.

Thus, the number of elements in the driver circuit can be decreased, and the power of the semiconductor device can be reduced.

BRIEF DESCRIPTION OF THE DRAWINGS

In the accompanying drawings:

FIG. 3 is a timing chart;

FIGS. 16A to 16G are cross-sectional views for illustrating a method for manufacturing a semiconductor substrate used in a semiconductor device;

DETAILED DESCRIPTION OF THE INVENTION

Figure 1A:
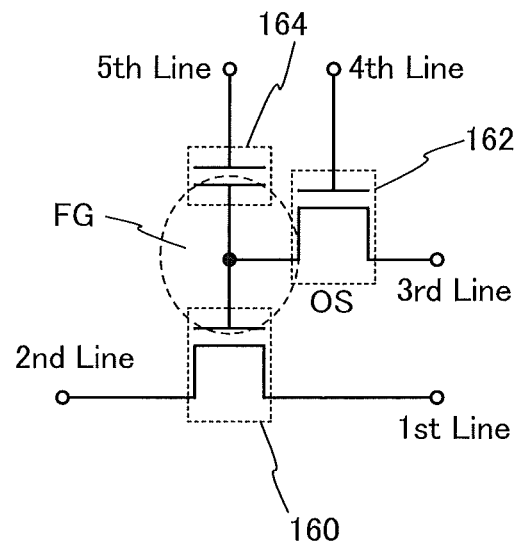
FIGS. 1A and 1B are circuit diagrams of semiconductor devices.

Examples of embodiments of the disclosed invention will be described below with reference to the drawings. Note that the present invention is not limited to the following description. It will be readily appreciated by those skilled in the art that modes and details of the present invention can be changed in various ways without departing from the spirit and scope of the present invention. The present invention therefore should not be construed as being limited to the following description of the embodiments.

Note that the position, size, range, or the like of each component illustrated in drawings and the like is not accurately represented in some cases for easy understanding. The disclosed invention is therefore not necessarily limited to the position, size, range, or the like disclosed in the drawings and the like.

Note that in this specification and the like, ordinal numbers such as "first", "second", and "third" are used in order to avoid confusion among components and do not limit the number.

(Embodiment 1)

In this embodiment, circuit structures and operation of semiconductor devices according to one embodiment of the disclosed invention are described with reference to FIGS. 1A and 1B, FIG. 2, FIG. 3, and FIG. 4. Note that in some circuit diagrams, "OS" is written beside a transistor in order to indicate that the transistor includes an oxide semiconductor material.

<Basic Circuit>

First, a basic circuit structure and operation of the circuit are described with reference to FIGS. 1A and 1B. FIG. 1A is a circuit diagram illustrating a basic circuit structure of each memory cell in the semiconductor device. In the circuit diagram illustrated in FIG. 1A, a first wiring (1st Line) and one of a source electrode and a drain electrode (e.g., the drain electrode) of a transistor 160 are electrically connected to each other, and a second wiring (2nd Line) and the other of the source electrode and the drain electrode (e.g., the source electrode) of the transistor 160 are electrically connected to each other. In addition, a third wiring (3rd Line) and one of a source electrode and a drain electrode (e.g., the drain electrode) of a transistor 162 are electrically connected to each other, and a fourth wiring (4th Line) and a gate electrode of the transistor 162 are electrically connected to each other. Further, a gate electrode of the transistor 160 and the other of the source electrode and the drain electrode (e.g., the source electrode) of the transistor 162 are electrically connected to one electrode of a capacitor 164, and a fifth wiring (5th Line) and the other electrode of the capacitor 164 are electrically connected to each other.

Here, a transistor including an oxide semiconductor material (a transistor which includes a channel in an oxide semiconductor layer) is used as the transistor 162, for example. The off-state current of a transistor including an oxide semiconductor material is extremely low. Thus, when the transistor 162 is turned off, the potential of the gate electrode of the transistor 160 can be held for an extremely long time.

Note that the transistor 160 may include any material, and there is no particular limitation on the material of the transistor 160. In order to increase the speed of reading data, it is preferable to use, for example, a transistor with high switching speed, such as a transistor formed using single crystal silicon (a transistor which includes a channel in a single crystal silicon substrate or a single crystal silicon layer) as the transistor 160.

The semiconductor device illustrated in FIG. 1A can write and read data as described below, utilizing a feature in which the potential of the gate electrode of the transistor 160 can be held for an extremely long time.

First, data writing is described. First, the potential of the fourth wiring is set to a potential at which the transistor 162 is turned on, so that the transistor 162 is turned on. Thus, the potential of the third wiring is applied to the gate electrode of the transistor 160 and the capacitor 164. That is, predetermined electrical charge is given to the gate electrode of the transistor 160. Here, one of electrical charges corresponding to two different potentials (hereinafter, an electrical charge for supply of a low potential is referred to as an electrical charge $Q_L$ and an electrical charge for supply of a high potential is referred to as an electrical charge $Q_H$) is selectively given to the gate electrode of the transistor 160 and the capacitor 164. When one of $Q_L$ and $Q_H$ corresponds to data "1" and the other of $Q_L$ and $Q_H$ corresponds to data "0" here, one-bit data can be written to the memory cell. Note that when an electrical charge to be given to the gate electrode of the transistor 160 is selected from electrical charges corresponding to three or more different potentials, multivalued (multiple-bit) data is written to each memory cell so that the storage capacity of the semiconductor device is improved. After that, the potential of the fourth wiring is set to a potential at which the transistor 162 is turned off, so that the transistor 162 is turned off. Thus, the electrical charge given to the gate electrode of the transistor 160 and the capacitor 164 is stored.

Since the off-state current of the transistor 162 is extremely low, the electrical charge of the gate electrode of the transistor 160 and the capacitor 164 is stored for a long time.

Next, data reading is described. When an appropriate potential (a reading potential) is applied to the fifth wiring while a predetermined potential (a constant potential) is applied to the second wiring, the resistance of the transistor

160 varies depending on the amount of electrical charge stored in the gate electrode of the transistor 160. This is generally because, when the transistor 160 is an n-channel transistor, the apparent threshold voltage $V_{th\_H}$ of the transistor 160 at the time when $Q_H$ is given to the gate electrode of the transistor 160 is lower than the apparent threshold voltage $V_{th\_L}$ of the transistor 160 at the time when $Q_L$ is given to the gate electrode of the transistor 160. Here, the apparent threshold voltage is the potential of the fifth wiring that is needed to turn on the transistor 160. Thus, a potential (a read potential) applied to the fifth wiring is set to a potential $V_0$ that is intermediate between $V_{th\_H}$ and $V_{th\_L}$, so that electrical charge given to the gate electrode of the transistor 160 can be determined at the time of writing data. For example, in the case where $Q_H$ is given to the gate electrode of the transistor 160 in writing, when the potential of the fifth wiring is set to $V_0$ ($>V_{th\_H}$), the transistor 160 is turned on. On the other hand, in the case where $Q_L$ is given to the gate electrode of the transistor 160 in writing, even when the potential of the fifth wiring is set to $V_0$ ($<V_{th\_L}$), the transistor 160 is kept off. Accordingly, stored data can be read when the resistive state of the transistor 160 is detected.

Note that in the case where a plurality of memory cells are arrayed, it is necessary that data of only a desired memory cell be read.

For example, in the case of a structure in which the transistors 160 in the plurality of memory cells are electrically connected in series (a NAND structure), operation is performed as follows when data of a predetermined memory cell is read and data of the other memory cells is not read. A potential at which the transistors 160 are turned on regardless of electrical charge given to the gate electrodes at the time of writing data, that is, a potential that is higher than $V_{th\_L}$ is applied to the fifth wirings in the memory cells that are not targets for data reading.

For example, in the case of a structure in which the transistors 160 in the plurality of memory cells are not connected in series but electrically connected to wirings (a NOR structure), operation is performed as follows when data of a predetermined memory cell is read and data of the other memory cells is not read. A potential at which the transistors 160 are turned off regardless of electrical charge given to the gate electrodes at the time of writing data, that is, a potential that is lower than $V_{th\_H}$ is applied to the fifth wirings in the memory cells that are not targets for data reading.

Next, data rewriting is described. Data rewriting is performed in a manner similar to those of data writing and data retention. That is, the potential of the fourth wiring is set to a potential at which the transistor 162 is turned on, so that the transistor 162 is turned on. Thus, the potential of the third wiring (a potential corresponding to new data) is applied to the gate electrode of the transistor 160 and the capacitor 164. After that, the potential of the fourth wiring is set to a potential at which the transistor 162 is turned off, so that the transistor 162 is turned off. Accordingly, electrical charge corresponding to the new data is stored in the gate electrode of the transistor 160.

In the semiconductor device according to the disclosed invention, it is not necessary to write new data after written data is erased, and data can be directly rewritten by another data writing, as described above. Thus, the decrease in operation speed due to erasing operation can be suppressed. That is, the semiconductor device can operate at high speed.

Note that the gate electrode of the transistor 160 is electrically connected to the drain electrode (or the source electrode) of the transistor 162 and the capacitor 164, so that it has a function similar to that of a floating gate of a floating-gate transistor which is used as a non-volatile memory element. In the following description, a portion where the gate electrode of the transistor 160 is electrically connected to the drain electrode (or the source electrode) of the transistor 162 and the capacitor 164 is called a node FG in some cases. When the transistor 162 is off, the node FG can be regarded as being embedded in an insulator and electrical charge is stored in the node FG. The amount of off-state current of the transistor 162 including an oxide semiconductor material is smaller than or equal to one hundred thousandth of the amount of off-state current of a transistor including a channel formed in a silicon layer; thus, loss of the electrical charge accumulated in the node FG due to the leakage current of the transistor 162 is negligible. In other words, with the transistor 162 including an oxide semiconductor material, a non-volatile memory device which can retain data without supply of power can be realized.

For example, when the off-state current of the transistor 162 is 10 zA (1 zA (zeptoampere) is $1 \times 10^{-21}$ A) or less at room temperature (25° C.) and the capacitance value of the capacitor 164 is approximately 10 fF, data can be retained for $10^4$ s or longer. Note that it is needless to say that the retention time depends on transistor characteristics and the capacitance value of the capacitor.

Further, in the semiconductor device of the disclosed invention, the problem of deterioration of a gate insulating layer (a tunnel insulating layer), which is pointed out in a conventional floating gate transistor, does not exist. That is, the deterioration of a gate insulating layer due to injection of electrons into a floating gate, which is a conventional problem, can be solved. This means that there is no limitation on the number of writing in principle. Further, high voltage needed for writing or erasing data in a conventional floating gate transistor is not necessary.

Figure 1B:
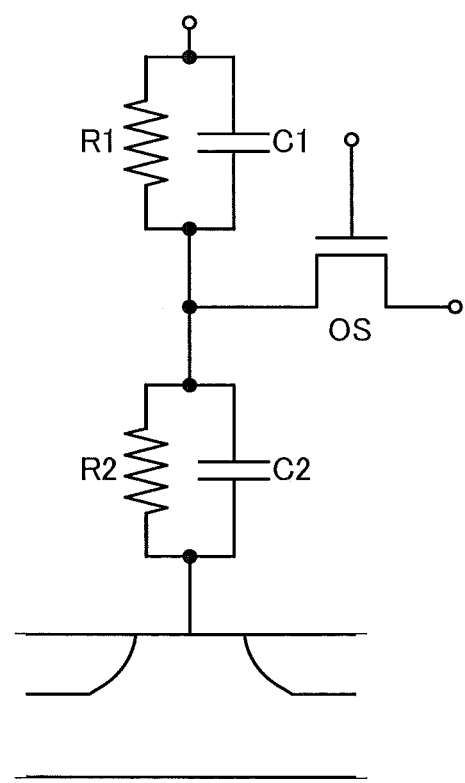

Components such as transistors in the semiconductor device illustrated in FIG. 1A can be regarded as including a resistor and a capacitor as illustrated in FIG. 1B. That is, in FIG. 1B, the transistor 160 and the capacitor 164 are each regarded as including a resistor and a capacitor. R1 and C1 denote the resistance and the capacitance of the capacitor 164, respectively. The resistance R1 corresponds to the resistance of an insulating layer included in the capacitor 164. R2 and C2 denote the resistance and the capacitance of the transistor 160, respectively. The resistance R2 corresponds to the resistance of a gate insulating layer at the time when the transistor 160 is on. The capacitance C2 corresponds to so-called gate capacitance (capacitance formed between the gate electrode and the source electrode or the drain electrode and capacitance formed between the gate electrode and a channel formation region).

A storage period of electrical charge accumulated in the node FG (also referred to as a data retention period) is determined mainly by the off-state current of the transistor 162 under the conditions that gate leakage current (leakage current generated between a gate electrode and a source electrode or leakage current generated between a gate electrode and a drain electrode) of the transistor 162 is sufficiently low and that R1 $\geq$ ROS and R2 $\geq$ ROS are satisfied, where the resistance (also referred to as effective resistance) between the source electrode and the drain electrode at the time when the transistor 162 is off is ROS.

In contrast, when the conditions are not satisfied, it is difficult to sufficiently secure the data retention period even if the off-state current of the transistor 162 is low enough. This is because leakage current other than the off-state current of the transistor 162 (e.g., leakage current generated between the gate electrode and the source electrode of the transistor 160)

is high. Thus, it can be said that the semiconductor device disclosed in this embodiment preferably satisfies R1≧ROS and R2≧ROS.

It is preferable that C1≧C2 be satisfied. This is because when C1 is large, the potential of the fifth wiring can be applied to the node FG efficiently at the time of controlling the potential of the node FG by the fifth wiring, and a difference between potentials (e.g., a potential for selecting data reading and a potential for not selecting data reading) applied to the fifth wiring can be decreased.

When the above relation is satisfied in this manner, a more favorable semiconductor device can be realized. Note that R1 and R2 are controlled by the gate insulating layer of the transistor 160 and the insulating layer of the capacitor 164. Similarly, C1 and C2 are controlled by the gate insulating layer of the transistor 160 and the insulating layer of the capacitor 164. Thus, the material, the thickness, and the like of the gate insulating layer are preferably set as appropriate so that the above relation is satisfied.

In the semiconductor device described in this embodiment, the node FG has a function similar to that of a floating gate of a floating gate transistor in a flash memory or the like, but the node FG of this embodiment has a feature which is essentially different from that of a floating gate in a flash memory or the like.

In the case of a flash memory, since a potential applied to a control gate is high, it is necessary to leave a proper space between memory cells in order to prevent the potential from affecting a floating gate of an adjacent memory cell. This is one of the factors inhibiting high integration of the semiconductor device. The factor is due to the basic principle of a flash memory: tunneling current is generated by application of a high electric field.

In contrast, the semiconductor device of this embodiment is operated by switching of a transistor including an oxide semiconductor material and does not use the principle of injection of electrical charge into a floating gate by tunneling current. That is, unlike a flash memory, a high electric field for injection of electrical charge into a floating gate is not necessary. Accordingly, it is not necessary to consider the influence of a high electric field on an adjacent memory cell, which facilitates high integration.

In addition, the semiconductor device of this embodiment is advantageous over a flash memory also in that a large peripheral circuit (e.g., a step-up circuit (a step-up DC-DC converter)) for generating a high electric field is not necessary because a high electric field is not needed. For example, the highest voltage applied to the memory cell of this embodiment (the difference between the highest potential and the lowest potential applied to terminals of the memory cell at the same time) can be 5 V or lower, preferably 3 V or lower in one memory cell in the case where two levels (one bit) of data are written.

In the case where the relative dielectric constant ∈r1 of the insulating layer included in the capacitor 164 is different from the relative dielectric constant ∈r2 of the insulating layer included in the transistor 160, it is easy to satisfy C1≧C2 while 2×S2≧S1 (preferably S2≧S1) is satisfied, where S1 is the area of the insulating layer included in the capacitor 164 and S2 is the area of the insulating layer forming gate capacitance in the transistor 160. That is, it is easy to satisfy C1≧C2 while the area of the insulating layer included in the capacitor 164 is made small. Specifically, for example, a film formed using a high-k material such as hafnium oxide or a stack of a film formed using a high-k material such as hafnium oxide and a film formed using an oxide semiconductor material is used for the insulating layer included in the capacitor 164 so that ∈r1 can be set to 10 or more, preferably 15 or more, and silicon oxide is used for the insulating layer forming gate capacitance in the transistor 160 so that ∈r2 can be set to 3 to 4. A combination of such structures enables higher integration of the semiconductor device according to the disclosed invention.

Application Example

Next, a more specific circuit structure to which the circuit illustrated in FIGS. 1A and 1B is applied and operation of the circuit are described with reference to FIG. 2 and FIG. 3.

Figure 2:
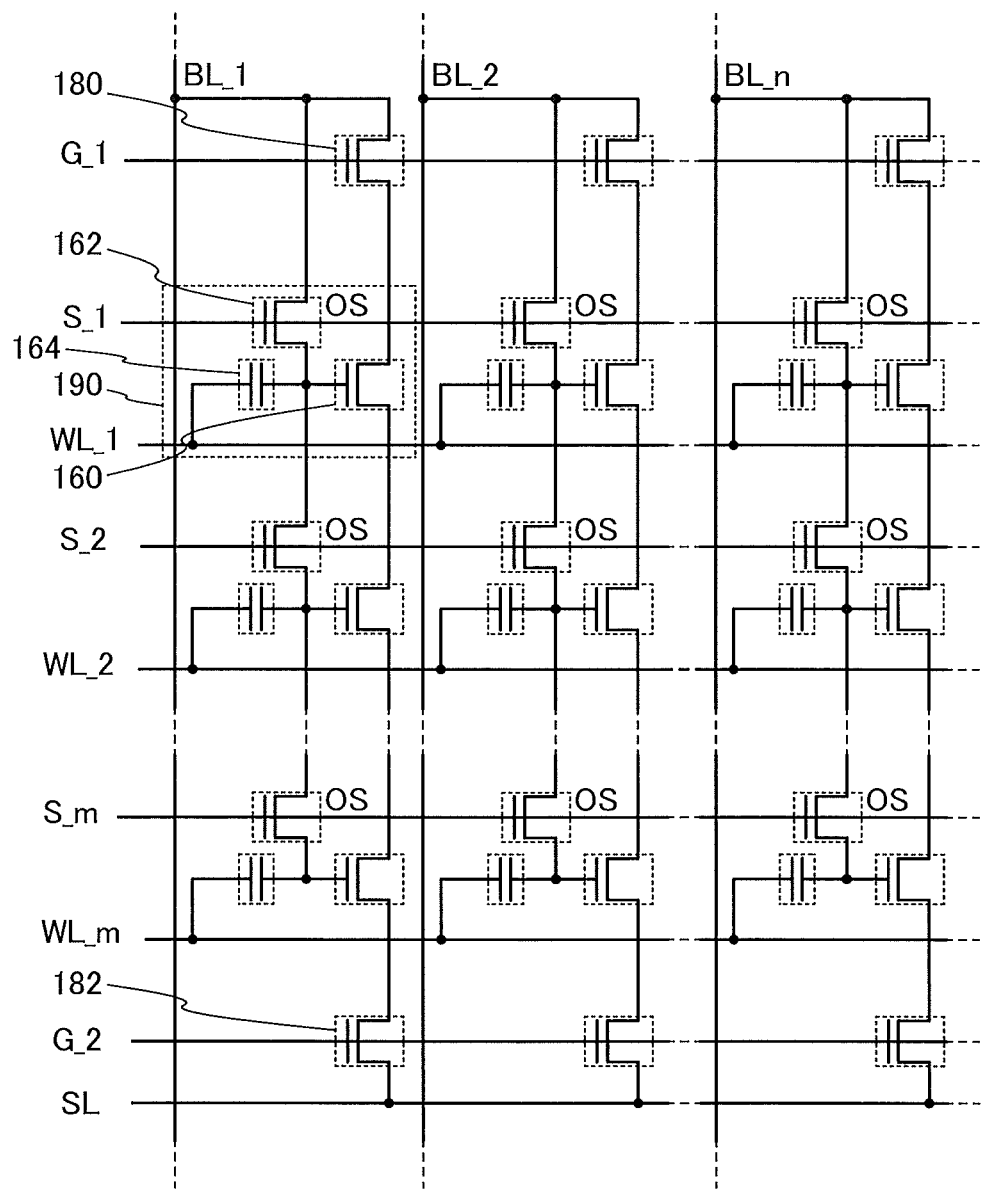
FIG. 2 is a circuit diagram of a semiconductor device.

FIG. 2 is an example of a circuit diagram of a NAND semiconductor device including m (m is a natural number of 3 or more) rows (in a vertical direction)×n (n is a natural number) columns (in a horizontal direction) memory cells 190. Note that actually, the NAND semiconductor device can include a plurality of sets of m rows (in the vertical direction)×n columns (in the horizontal direction) cells. In FIG. 2, in the case where a plurality of wirings have similar functions, the wirings are distinguished by "_1", "_2", and the like added to the end of their names.

The semiconductor device illustrated in FIG. 2 includes m word lines WL (WL_1 to WL_m), m signal lines S(S_1 to S_m), n bit lines BL (BL_1 to BL_n), a memory cell array including the memory cells 190 that are arranged in matrix of m rows in the vertical direction×n columns in the horizontal direction, a source signal line SL, selection lines G_1 and G_2, n selection transistors 180, and n selection transistors 182.

The n selection transistors 180 are provided between the bit line BL and the memory cells 190 in a first row along the selection line G_1, and the selection line G_1 and gate electrodes of the n selection transistors 180 are electrically connected to each other. The n selection transistors 182 are provided between the memory cells 190 in an m-th row and the source line SL along the selection line G_2, and the selection line G_2 and gate electrodes of the n selection transistors 182 are electrically connected to each other.

The bit lines BL are electrically connected to the drain electrodes of the transistors 162 in the memory cells 190 in the first row, and are electrically connected to the drain electrodes of the transistors 160 in the memory cells 190 in the first row through the selection transistors 180. The source line SL is electrically connected to the source electrodes of the transistors 160 in the memory cells 190 in the m-th row through the selection transistors 182.

The word line WL_k in a k-th row (k is a natural number of 1 or more and m or less) is electrically connected to one electrode of each of the capacitors 164 in the memory cells 190 in the k-th row. The signal line S in the k-th row is electrically connected to the gate terminals of the transistors 162 in the memory cells 190 in the k-th row.

The drain electrodes of the transistors 160 in the memory cells 190 in a j-th row (j is a natural number of 3 or more and m or less) are electrically connected to the source electrodes of the transistors 160 in the memory cells 190 in a (j−1)-th row.

The drain electrodes of the transistors 162 in the memory cells 190 in the j-th row are electrically connected to the gate electrodes of the transistors 160, the source electrodes of the transistors 162, and the other electrode of each of the capacitors 164 in the memory cells 190 in the (j−1)-th row. In addition, in the memory cells 190 in the m-th row, the gate electrodes of the transistors 160, the source electrodes of the transistors 162, and the other electrode of each of the capacitors 164 are electrically connected to each other.

The structure of the memory cells 190 in FIG. 2 is similar to that in FIG. 1A. In other words, in the memory cell in the k-th row and a q-th column (q is a natural number of 1 to n), the first wiring and the third wiring in FIG. 1A are electrically connected to the bit line BL_q in FIG. 2 in common, and the second wiring in FIG. 1A is electrically connected to the source line SL in FIG. 2. Further, the fourth wiring in FIG. 1A is electrically connected to the signal line S_k in FIG. 2, and the fifth wiring in FIG. 1A is electrically connected to the word line WL_k in FIG. 2.

Note that in FIG. 2, the transistors 162 in the memory cells 190 are electrically connected in series in a column direction and the transistors 160 in the memory cells 190 are electrically connected in series in the column direction; thus, only the memory cells in the first row are electrically connected to the bit lines BL without the other memory cells, and only the memory cells in the m-th row are electrically connected to the source line SL without the other memory cells. The memory cell in the other row is electrically connected to the bit line BL and the source line SL through the other memory cells in the same column.

Here, in the semiconductor device illustrated in FIG. 2, the nodes FG in the memory cells 190 in the (j−1)-th row each have the structure in FIG. 1A, and are electrically connected to the drain electrodes of the transistors 162 in the memory cells 190 in the j-th row. The transistors 162 each including an oxide semiconductor material in the memory cells in the j-th row and the memory cells in the (j−1)th row have significantly low off-state current. Thus, in the memory cell 190 in the semiconductor device illustrated in FIG. 2, the potential of the node FG can be held for an extremely long time by turning off the transistor 162 as in the semiconductor device illustrated in FIG. 1A.

The transistors 162 in the plurality of memory cells 190 are electrically connected in series as in the structure illustrated in FIG. 2, so that the source electrode of the transistor 162 and the drain electrode of the transistor 162 can be in contact with each other or used in common among the memory cells 190. Accordingly, only one of the source electrode of the transistor 162 and the drain electrode of the transistor 162 is included in each memory cell 190.

On the other hand, in the case where the transistors 162 in the memory cells 190 are not connected in series and the source electrode and the drain electrode are provided for each of the transistors 162 in the memory cells 190, one of the source electrode and the drain electrode of the transistor 162 needs to be connected to a wiring such as the bit line BL through an opening. That is, both of the source electrode and the drain electrode of the transistor 162 and the opening for connection with the wiring are included in each memory cell 190.

Thus, as illustrated in FIG. 2, the transistors 162 in the memory cells 190 are electrically connected in series, so that the area of the memory cells 190 can be reduced. For example, the area of the memory cell 190 can be 6 to 12 $F^2$ assuming that the minimum feature size is F. Accordingly, the semiconductor device can be highly integrated, and storage capacity per unit area can be increased.

Note that the selection line G_1, the selection line G_2, the selection transistors 180, and the selection transistors 182 are not necessarily provided. It is possible not to provide the selection line G_1 and the selection transistors 180. Alternatively, it is possible not to provide the selection line G_2 and the transistors 182.

In the structure illustrated in FIG. 2, data writing and data reading are basically similar to those in FIGS. 1A and 1B. Note that data writing is performed at least for each row, and is performed sequentially for rows. This is because the nodes FG in the memory cells in the j-th row are connected to the nodes FG in the memory cells in the (j−1)th row that is the adjacent row through the transistors 162 in the memory cells in the j-th row. Operations of data writing, data retention, and data reading in the structure illustrated in FIG. 2 are described with reference to the timing chart in FIG. 3. Names such as "WL" and "BL" in the timing chart indicate wirings to which potentials illustrated in the timing chart are applied. The timing chart in FIG. 3 illustrates the case in which data "1" is written to the memory cell in the k-th row and a first column and data "0" is written to the memory cells in the k-th row and second to n-th columns and the case in which the data "1" is read from the memory cell in the k-th row and the first column and the data "0" is read from the memory cells in the k-th row and the second to n-th columns.

Either a potential V1 or a potential V2 (V1<V2) is applied to the node FG. Data stored when the potential V2 is applied to the node FG is the data "1", and data stored when the potential V1 is applied to the node FG is the data "0".

An example in which data is written to the memory cells in the k-th row is described. First, the potential of the selection line G_1 is, for example, a reference potential GND (0 V) and the potential of the selection line G_2 is V3 (e.g., a power supply potential VDD). In this manner, the selection transistors 182 are turned on and the selection transistors 180 are turned off. Note that data is written to the memory cells in the k-th row, the potential of the selection line G_1 may be V3 so that the selection transistors 180 are turned on. At least in a data writing period, a certain potential (e.g., the reference potential GND (0 V)) is applied to the source line SL.

The potential of the signal line S_k electrically connected to the gate electrodes of the transistors 162 in the memory cells 190 which are targets for data writing (the memory cells in the k-th row) is V4 (a potential which is higher than V2, for example, VDD). If the threshold voltage of the transistor 162 is denoted by $V_{th162}$, $V2+V_{th162}<V4$ is satisfied. In this manner, the transistors 162 in the memory cells in the k-th row are turned on, so that V2 or V1 is applied to the nodes FG in the memory cells in the k-th row. In the case where data "0" is written to the memory cells in the k-th row, V1 is applied to the bit lines BL. In the case where data "1" is written to the memory cells in the k-th row, V2 is applied to the bit lines BL. As in the expression "data writing in the k-th row" in the timing chart in FIG. 3, V2 is applied to the bit line BL_1 corresponding to the first column so that the data "1" is written to the k-th row and the first column, and V1 is applied to the bit lines BL_2 to BL_n corresponding to the second to n-th columns so that the data "0" is written to the k-th row and the second to n-th columns.

Note that in the case where other memory cells (the memory cells in the first to (k−1)th rows) are provided between the memory cells which are the targets for data writing (the memory cells in the k-th row) and the bit lines BL, the potentials of the signal lines S_1 to S_(k−1) are set to V4, the transistors 162 in the memory cells in the first to (k−1)th rows are turned on, and the potentials of the bit lines BL are applied to the drain electrodes of the transistors 162 in the memory cells which are the targets for data writing (the memory cells in the k-th row). In the case where data is written to the memory cells in the k-th row, the potentials of the signal lines S_(k+1) to S_m can be set to, for example, the reference potential GND (0 V). When the potentials of the gate electrodes of the transistors 162 in the memory cells in the (k+1)th to m-th rows are set to the reference potential GND (0 V) in this manner, the transistors 162 in the memory cells 190 in the (k+1)th to m-th rows can be turned off. This is because the potential V1 or the potential V2 is applied to the drain electrodes and the source electrodes of the transistors 162. That is, if the threshold voltage of the transistor 162 is denoted by $V_{th162}$, the potential V1 is selected so that $V_{th162}$+V1>0 is satisfied. Accordingly, electrical charge accumulated in the gate electrodes of the transistors 162 in the memory cells in the (k+1)th to m-th rows is stored. Note that the potentials of the signal lines S_(k+1) to S_m are not limited to 0 V and may be any potentials as long as the transistors 162 in the memory cells in the (k+1)th to m-th rows are turned off.

Data writing is completed when the potential of the signal line S_k which is electrically connected to the target memory cells 190 (the memory cells in the k-th row) is set to GND (0 V). When the potential of the signal line S_k is set to GND (0 V), the transistors 162 in the memory cells in the k-th row are turned off, so that electrical charge accumulated in the nodes FG is stored. In other words, when V2 corresponding to the data "1" is applied to the node FG, the potential of the node FG is set to V2, and when V1 corresponding to the data "0" is applied to the node FG, the potential of the node FG is set to V1.

Since the off-state current of the transistor 162 is extremely low, the electrical charge of the gate electrode of the transistor 160 is stored for a long time.

Note that in the case where data is written to the memory cells in the k-th row, it is necessary to turn on the transistors 162 in the memory cells in the first to k-th rows. Thus, it is necessary to write data to the memory cells in the (k−1)th row (the memory cells 190 which are closer to the bit lines BL) after data is written to the memory cells in the k-th row. In this manner, data writing and data retention are performed sequentially from the memory cells in the m-th row to the memory cells in the first row.

Next, an example in which data is read from the memory cells in the k-th row is described. Note that as for "data reading from the k-th row" in the timing chart in FIG. 3, data reading at the time when the data "1" is written to the memory cell in the k-th row and the first column and the data "0" is written to the memory cells in the k-th row and the second to n-th columns is described. The potential of the word line WL_k which is electrically connected to the capacitors 164 in the memory cells which are targets for data reading (the memory cells in the k-th row) is set to V0; the potentials of the word lines WL_1 to WL_(k−1) and WL_(k+1) to WL_m which are electrically connected to the capacitors 164 in the memory cells which are not targets for data reading (the memory cells in the first to (k−1)th rows to the (k+1)th to m-th rows) are set to V5; and the potentials of the selection lines G_1 and G_2 are set to V3.

When the potential of the word line WL_(k+1) which is electrically connected to the capacitors 164 in the memory cells which are the targets for data reading (the memory cells in the k-th row) is set to V0, in the case where the memory cells which are the targets for data reading (the memory cells in the k-th row) store the data "1", i.e., in the case where the potential V2 is applied to the nodes FG at the time of writing data, the transistors 160 in the memory cells in the k-th row are turned on. In contrast, in the case where the memory cells which are the targets for data reading (the memory cells in the k-th row) store the data "0", i.e., in the case where the potential V1 is applied to the nodes FG at the time of writing data, the transistors 160 in the memory cells in the k-th row are turned off. That is, the potential V0 is selected so that V1+V0×α<$V_{th160}$<V2+V0×α is satisfied. Note that α represents a coupling ratio (α=C1/(C1+C2)), and $V_{th160}$ represents the threshold voltage of the transistor 160. In other words, as described with reference to FIGS. 1A and 1B, the potential V0 is selected so as to be an intermediate potential between $V_{th\_H}$ and $V_{th\_L}$.

When the potentials of the word lines WL_1 to WL_(k−1) and WL_(k+1) to WL_m which are electrically connected to the capacitors 164 in the memory cells which are not the targets for data reading (the memory cells in the first to (k−1)th rows to the (k+1)th to m-th rows) are set to V5, the transistors 160 in the memory cells which are not the targets for data reading are turned on regardless of whether the data written to the memory cells which are not the targets for data reading (the memory cells in the first to (k−1)th rows to the (k+1)th to m-th rows) is "1" or "0". That is, the potential V5 is selected so that $V_{th160}$<V1+V5×α is satisfied.

When the potentials of the selection lines G_1 and G_2 are set to V3, the selection transistors 180 and the selection transistors 182 are turned on. Thus, the drain electrodes of the transistors 160 in the memory cells in the first row are electrically connected to the bit lines BL through the selection transistors 180 which are turned on, and the source electrodes of the transistors 160 in the memory cells in the m-th row are electrically connected to the source line SL through the selection transistors 182 which are turned on. At least in a data reading period, a certain potential (e.g., the reference potential GND (0 V)) is applied to the source line SL.

Figure 4:
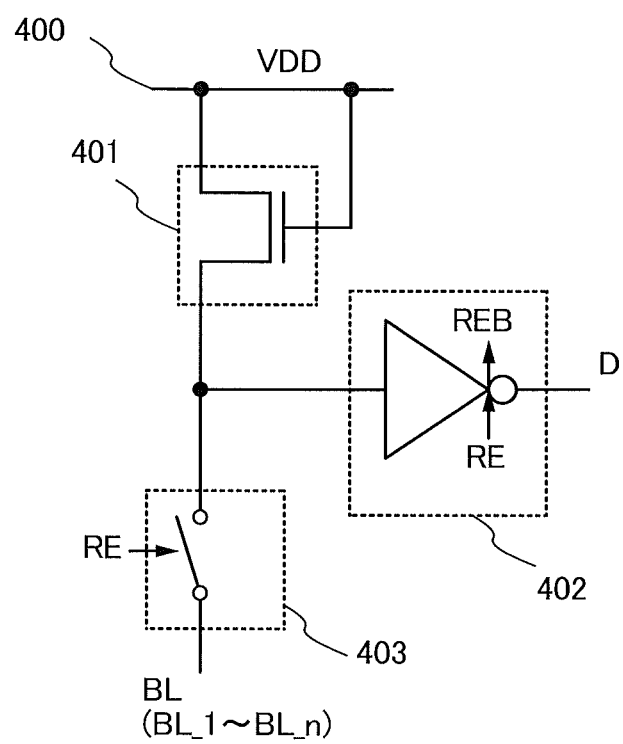
FIG. 4 is a circuit diagram of a semiconductor device.

A reading circuit is electrically connected to the bit line BL. FIG. 4 illustrates a structure example of the reading circuit. In the reading circuit illustrated in FIG. 4, the bit line BL (corresponding to the bit lines BL_1 to BL_n) is connected to a clocked inverter 402 and one of a source and a drain of a transistor 401 through a switch 403 controlled by a read enable signal (represented as "RE" in FIG. 4). A gate of the transistor 401 and the other of the source and the drain of the transistor 401 are electrically connected to a wiring 400. The read enable signal RE and a signal obtained by inversion of the read enable signal (represented as "REB" in FIG. 4) are input to the clocked inverter 402.

In the case where the data "1" is written to the memory cell which is the target for data reading (e.g., the memory cell in the k-th row and the q-th column), the transistor 160 in the memory cell is turned on when the data is read. Thus, all the transistors 160, the selection transistors 180, and the selection transistors 182 in the q-th column that are electrically connected to the corresponding bit line BL_q are turned on. In this manner, resistance between the bit line BL_q and the source line SL is lowered; a potential which is close to a potential applied to the source line SL (the reference potential GND (0 V)), i.e., a low potential is applied to the clocked inverter 402; and an output from the reading circuit (represented as "D" in FIG. 4) is close to VDD.

In contrast, in the case where the data "0" is written to the memory cell which is the target for data reading (e.g., the memory cell in the k-th row and the q-th column), the transistor 160 in the memory cell is turned off when the data is read. Thus, the resistance between the bit line BL_q and the source line SL is raised; a potential applied to the wiring 400 (the power supply potential VDD), i.e., a high potential is applied to the clocked inverter 402; and the output D from the reading circuit is 0 V.

In this manner, the resistance between the bit line BL_q and the source line SL is changed in accordance with data retained in the memory cell which is the target for data reading, so that the written data can be read.

Note that the structure of the reading circuit is not limited to the structure in FIG. 4. A circuit with any structure can be used as long as it can detect a difference in the resistance between the bit line BL and the source line SL.

In the semiconductor device described in this embodiment, with the use of a transistor which includes a channel in an oxide semiconductor layer in each memory cell, the outflow of electrical charge from a capacitor or the inflow of electrical charge into the capacitor at the time when the transistor is not selected can be suppressed because the transistor has extremely low off-state current. Accordingly, the semiconductor device can retain stored data for an extremely long time. In other words, refresh operation in the semiconductor device is not needed or the frequency of the refresh operation can be extremely decreased, which leads to a sufficient reduction in power consumption. Further, the semiconductor device can retain stored data for a long time even when power is not supplied (a potential applied to the semiconductor device is preferably not changed between the case where power is not supplied and the case where power is supplied).

Further, the semiconductor device described in this embodiment does not need high voltage for writing data to each memory cell, so that elements included in the semiconductor device are less likely to deteriorate. For example, in a conventional flash memory, electrons are injected into and extracted from a floating gate; thus, it is necessary to apply high voltage to an element such as a floating-gate transistor included in a semiconductor device. Thus, the problem of deterioration of a gate insulating layer of the transistor occurs. However, unlike the conventional flash memory, it is not necessary to apply high voltage to an element such as a transistor included in the semiconductor device according to the disclosed invention; thus, a gate insulating layer of the transistor is less likely to deteriorate. In other words, the semiconductor device according to the disclosed invention does not have the limitation on the number of writing, which is a problem of a conventional non-volatile memory device, and reliability thereof is markedly improved. Furthermore, data is written to each memory cell by control of the on and off of the transistor included in the semiconductor device, so that the high-speed operation of the semiconductor device can be easily realized.

In addition, a transistor including a material other than an oxide semiconductor (e.g., a transistor which includes a channel in a silicon substrate or a silicon layer) can operate at higher speed than a transistor including an oxide semiconductor material (a transistor which includes a channel in an oxide semiconductor layer). Thus, by combining a transistor including a material other than an oxide semiconductor and a transistor including an oxide semiconductor material, a semiconductor device can perform operation (e.g., data reading) at sufficiently high speed. Further, a transistor including a material other than an oxide semiconductor can favorably realize a variety of circuits (e.g., a logic circuit or a driver circuit) in the semiconductor device that need to operate at high speed.

A semiconductor device having a novel feature can be realized with provision of both the transistor including a material other than an oxide semiconductor (in a broader sense, a transistor capable of operating at sufficiently high speed) and the transistor including an oxide semiconductor material (in a broader sense, a transistor whose off-state current is sufficiently low).

In the semiconductor device described in this embodiment, the transistors each including an oxide semiconductor material in the memory cells of the semiconductor device are electrically connected in series, so that a source electrode of the transistor including an oxide semiconductor material in the memory cell and a drain electrode of the transistor including an oxide semiconductor material in the adjacent memory cell can be in contact with each other or used in common between the adjacent memory cells. Here, in the case where the transistors each including an oxide semiconductor material in the memory cells are not electrically connected in series, for example, it is necessary to provide an opening in an interlayer insulating film or the like so that the source electrodes or the drain electrodes of the transistors can be connected to a wiring provided in a layer which is different from layers in which the source electrodes or the drain electrodes are provided. Thus, an area needed for connection of wirings is increased in the memory cells. In contrast, in the case where the transistors each including an oxide semiconductor material are electrically connected in series between the plurality of memory cells as in the semiconductor device according to the disclosed invention, a source electrode of the transistor including an oxide semiconductor material in the memory cell and a drain electrode of the transistor including an oxide semiconductor material in the adjacent memory cell can be in contact with each other or used in common between the adjacent memory cells; thus, the area of one memory cell can be reduced. Accordingly, the semiconductor device can be highly integrated and storage capacity per unit area can be increased.

In the structure illustrated in FIG. 2, the transistors 162 each including an oxide semiconductor material are electrically connected in series; thus, it is necessary that data writing be performed sequentially from the memory cell 190 which is most distant from the bit line BL to the memory cell 190 which is closest to the bit line BL. Thus, it is necessary that the transistor 162 in the memory cell 190 to which data is written be turned on and all the transistors 162 that are connected to the bit line BL from the memory cell 190 to which data is written be turned on. For example, in the case where data is written to the transistors 162 in the memory cells 190 in the (m−1)th row, electrical charge may be given to the gate electrodes of the transistors 160 in the memory cells 190 in the (m−1)th row while the transistors 162 in the memory cells 190 in the m-th row are turned off and the transistors 162 in the memory cells 190 in the first to (m−1)th rows are turned on. Then, the transistors 162 in the memory cells 190 in the (m−1)th row may be turned off so that data is written to the memory cells 190 in the (m−1)th row. Such data writing can be performed by connection of a circuit to the signal line S. An example in which a circuit is connected to the signal line S is described below.

<Two-Bit Memory+Driver Circuit>

A driver circuit for outputting signals to the signal lines S is described with reference to FIGS. 5A and 5B. In a circuit diagram illustrated in FIG. 5A, the structure of a memory cell array corresponds to the structure illustrated in FIG. 2, where m is 2 and n is 1. The driver circuit includes circuits 800, 810, and 820. A write control signal WRITE and a row address selection signal ADD_2 are input to the circuit 800. The write control signal WRITE and a row address selection signal ADD_1 are input to the circuit 820. An output from the circuit 820 and an output from the circuit 800 are input to the circuit 810. The output from the circuit 800 is output to the signal line S_2, and an output from the circuit 810 is output to the signal line S_1.

Figure 5A:
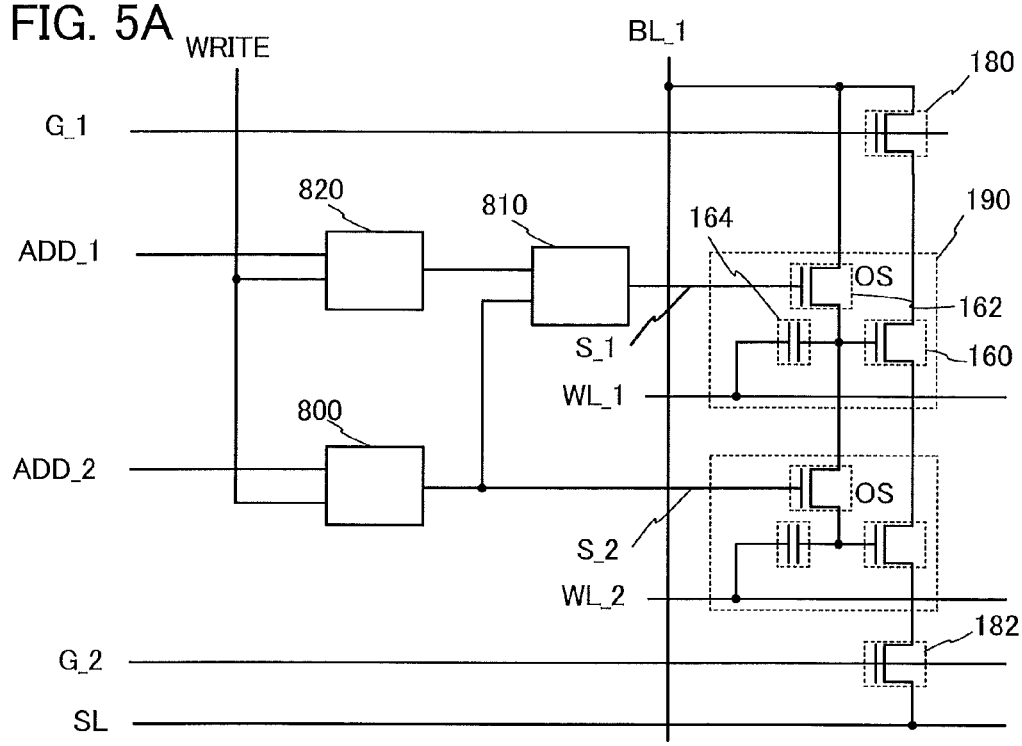
FIGS. 5A and 5B are circuit diagrams of semiconductor devices.

Data writing and data reading in a memory cell in FIG. 5A can be similar to data writing and data reading in FIG. 2; thus, detailed description thereof is omitted.

The operation of the circuits 800, 810, and 820 is described with reference to FIG. 5A.

First, in the case where data is written to the memory cell 190 in the second row, the output from the circuit 800 is "1" and a signal "1" is input to the signal line S_2. The circuit 810 is a circuit whose output is "1" when at least one of the output from the circuit 800 and the output from the circuit 820 is "1".

Thus, when the output from the circuit 800 is "1", the output from the circuit 810 is inevitably "1". Accordingly, when the signal "1" (i.e., a signal for turning on the transistor 162 in the memory cell 190 in the second row) is input to the signal line S_2, the signal "1" (i.e., a signal for turning on the transistor 162 in the memory cell 190 in the first row) is input to the signal line S_1. That is, the driver circuit generates a signal to be input to the signal line S_1 in accordance with a signal to be input to the signal line S_2. In this manner, a driver circuit with a simple structure can generate a signal with which the transistor 162 connected between the memory cell 190 in the second row and the bit line BL_1 (the transistor 162 in the memory cell 190 in the first row) is turned on when the transistor 162 in the memory cell 190 that is distant from the bit line (the memory cell in the second row) is turned on. Consequently, data can be written to the memory cell 190 in the second row that is distant from the bit line BL_1.

Next, in the case where data is written to the memory cell 190 in the first row, the output from the circuit 800 is "0" and a signal "0" is input to the signal line S_2. The output from the circuit 810 is "1" in the case where the output from the circuit 820 is "1" even if the output from the circuit 800 is "0". Thus, the output from the circuit 810 is "1" and the signal "1" is input to the signal line S_1. Since the output from the circuit 800 is "1" and the output from the circuit 810 is "0", the transistor 162 in the memory cell 190 in the second row is turned off, and the transistor 162 in the memory cell 190 in the first row is turned on. Since the data is written to the memory cell 190 in the second row first, electrical charge is accumulated in the capacitor 164 in the memory cell 190 in the second row. By turning off the transistor 162 in the memory cell 190 in the second row at the time when data is written to the memory cell 190 in the first row, the electrical charge accumulated in the capacitor 164 in the memory cell 190 in the second row can be stored. Further, since the transistor 162 in the memory cell 190 in the first row is turned on, the data can be written to the memory cell 190 in the first row.

Figure 5B:
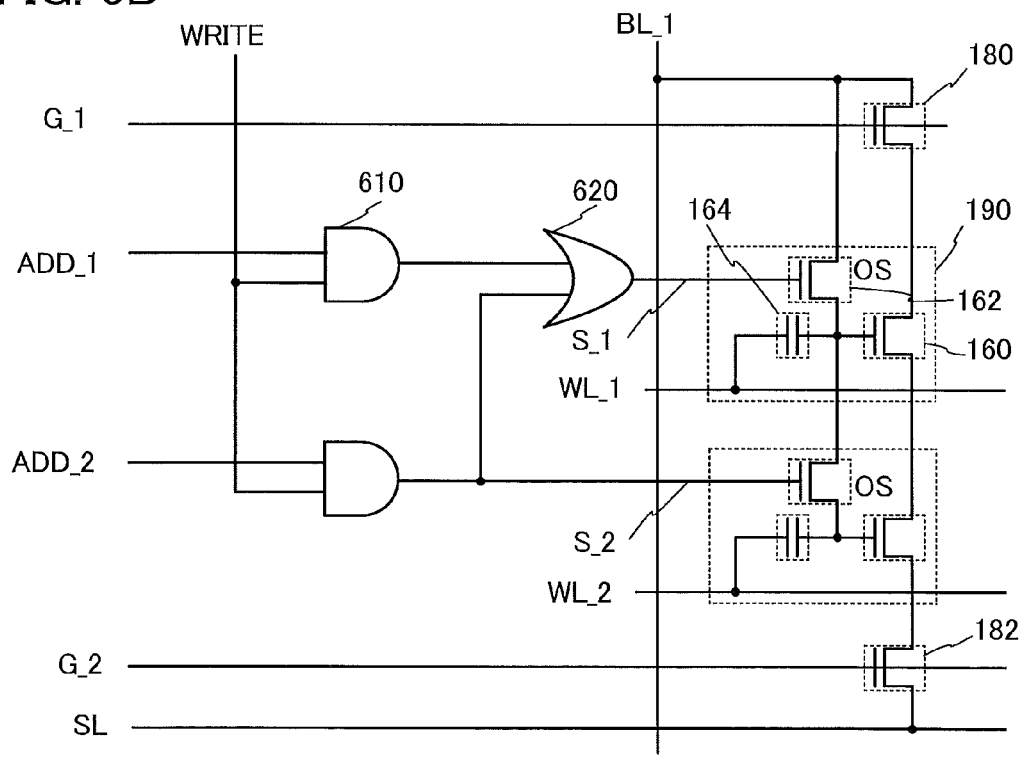

As an example of the structure of such a driver circuit, AND circuits can be used as the circuits 800 and 820 and an OR circuit can be used as the circuit 810 (see FIG. 5B).

Here, a transistor including an oxide semiconductor material (a transistor which includes a channel in an oxide semiconductor layer) is used as each of the transistors 162 in the memory cells 190 in the first row and the second row, for example. The off-state current of a transistor including an oxide semiconductor material is extremely low. Thus, when the transistors 162 in the memory cells 190 in the first row and the second row are turned off, the potentials of the gate electrodes of the transistors 160 in the memory cells 190 in the first row and the second row can be held for an extremely long time.

Note that a transistor including any material may be used as each of the transistors 160 in the memory cells 190 in the first row and the second row, and there is no particular limitation on the transistor 160. In order to increase the speed of reading data it is preferable to use, for example, a transistor with high switching speed, such as a transistor formed using single crystal silicon (a transistor which includes a channel in a single crystal silicon substrate or a single crystal silicon layer) as the transistor 160.

The driver circuit for outputting signals to the signal lines has the above structure. That is, the driver circuit generates a signal to be output to the signal line S_1 in accordance with a signal to be output to the signal line S_2. In this manner, a driver circuit with a simple structure can generate a signal with which the transistor 162 connected between the memory cell 190 in the second row and the bit line BL_1 (the transistor 162 in the memory cell in the first row) is turned on when the transistor 162 in the memory cell 190 that is distant from the bit line (the memory cell in the second row) is turned on.

Thus, the number of elements in the driver circuit can be decreased, and the power of the semiconductor device can be reduced.

<Plurality of Memories+Driver Circuit>

Next, a more specific circuit structure to which the circuit illustrated in FIGS. 5A and 5B is applied and operation of the circuit are described with reference to FIG. 6 and FIG. 7.

Figure 6:
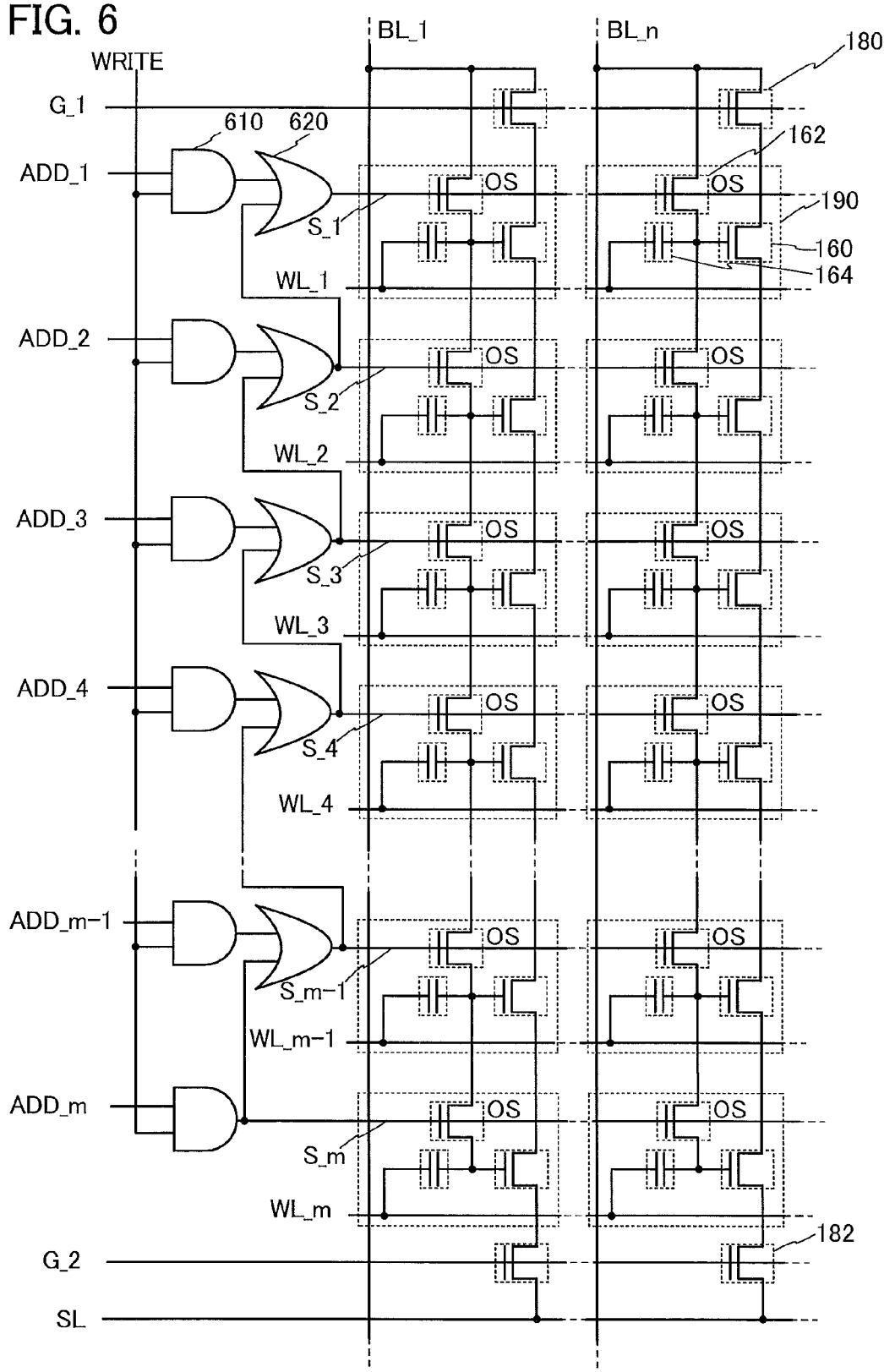
FIG. 6 is a circuit diagram of a semiconductor device.
Figure 7:
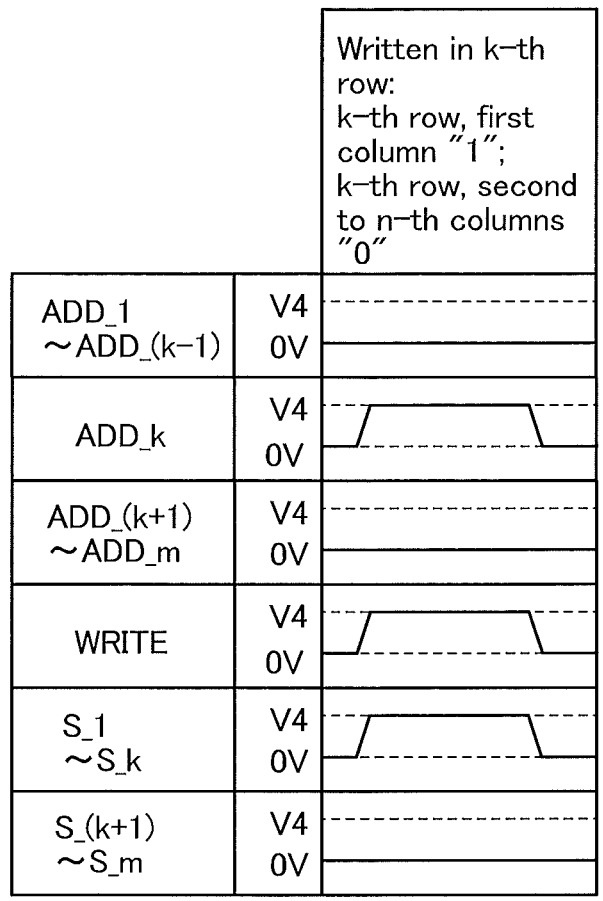
FIG. 7 is a timing chart.

FIG. 6 is an example of a circuit diagram of a NAND semiconductor device including m (m is a natural number of 3 or more) rows (in a vertical direction)×n (n is a natural number) columns (in a horizontal direction) memory cells 190. Note that actually, the NAND semiconductor device can include a plurality of sets of m rows (in the vertical direction)×n columns (in the horizontal direction) cells. In FIG. 6, in the case where a plurality of wirings have similar functions, the wirings are distinguished by "_1", "_2", and the like added to the end of their names.

For the structure of the memory cells 190 in FIG. 6, the description in FIG. 2 may be referred to; thus, detailed description thereof is omitted.

The semiconductor device illustrated in FIG. 6 includes the write control signal WRITE, m row address selection signals ADD (ADD_1 to ADD_m), (m−1) OR circuits 620, and m AND circuits 610.

An output of the write control signal WRITE and an output of the j-th row address selection signal ADD_j are input to a j-th AND circuit 610. An output from a j-th OR circuit 620 and an output from a (j−1)th AND circuit 610 are input to a (j−1)th OR circuit 620. In addition, an output from the (j−1)th OR circuit 620 is output to the (j−1)th signal line S_(j−1).

As illustrated in FIG. 6, the transistors 162 in the memory cells 190 are electrically connected in series, so that the area of the memory cells 190 can be reduced. For example, the area of the memory cell 190 can be 6 to 12 $F^2$ assuming that the minimum feature size is F. Accordingly, the semiconductor device can be highly integrated, and storage capacity per unit area can be increased.

Note that the selection line G_1, the selection line G_2, the selection transistors 180, and the selection transistors 182 are not necessarily provided. It is possible not to provide the selection line G_1 and the selection transistors 180. Alternatively, it is possible not to provide the selection line G_2 and the transistors 182.

In the structure illustrated in FIG. 6, for data writing and data reading, the description in FIG. 2 may be referred to; thus, detailed description thereof is omitted. Operations of the AND circuit 610 and the OR circuit 620 at the time of writing data in the structure illustrated in FIG. 6 are described with reference to a timing chart in FIG. 7. In the timing chart in FIG. 7, "ADD", "WRITE" and "S" indicate a row address selection signal, the potential of a write control signal, and the potential of a signal line, respectively. The timing chart in FIG. 7 illustrates the case in which data "1" is written to the memory cell in the k-th row and the first column and data "0" is written to the memory cells in the k-th row and the second to n-th columns.

An output from a k-th AND circuit 610 is "1" by setting the write control signal WRITE and the k-th row address selection signal ADD_k to "1". In this manner, an output from a k-th OR circuit is "1", so that the transistors 162 in the memory cells 190 in the k-th row are turned on by a signal input to a k-th signal line. Outputs from first to (k−1)th OR circuits 620 are "1" with the use of the signal input to the k-th signal line (the output "1" from the k-th OR circuit); "1" is input to the signal lines S_1 to S_(k−1); and the transistors 162 in the memory cells 190 in the first to (k−1)th rows are turned on. Further, (k+1)th to m-th row address selection signals are "0" though the write control signal WRITE is "1"; thus, outputs from (k+1)th to m-th AND circuits 610 are "0". In this manner, outputs from (k+1)th to m-th OR circuits are "0", so that the transistors 162 in the memory cells 190 in the (k+1)th to m-th rows are turned off.

In the semiconductor device described in this embodiment, with the use of a transistor which includes a channel in an oxide semiconductor layer in each memory cell, the outflow of electrical charge from a capacitor or the inflow of electrical charge into the capacitor at the time when the transistor is not selected can be suppressed because the transistor has extremely low off-state current. Accordingly, the semiconductor device can retain stored data for an extremely long time. In other words, refresh operation in the semiconductor device is not needed or the frequency of the refresh operation can be extremely decreased, which leads to a sufficient reduction in power consumption. Further, the semiconductor device can retain stored data for a long time even when power is not supplied (a potential applied to the semiconductor device is preferably not changed between the case where power is not supplied and the case where power is supplied).

Further, the semiconductor device described in this embodiment does not need high voltage for writing data to each memory cell, so that elements included in the semiconductor device are less likely to deteriorate. For example, in a conventional flash memory, electrons are injected into and extracted from a floating gate; thus, it is necessary to apply high voltage to an element such as a floating-gate transistor included in a semiconductor device. Thus, the problem of deterioration of a gate insulating layer of the transistor occurs. However, unlike the conventional flash memory, it is not necessary to apply high voltage to an element such as a transistor included in the semiconductor device according to the disclosed invention; thus, a gate insulating layer of the transistor is less likely to deteriorate. In other words, the semiconductor device according to the disclosed invention does not have the limitation on the number of writing, which is a problem of a conventional non-volatile memory device, and reliability thereof is markedly improved. Furthermore, data is written to each memory cell by control of the on and off of the transistor included in the semiconductor device, so that the high-speed operation of the semiconductor device can be easily realized.

In addition, a transistor including a material other than an oxide semiconductor (e.g., a transistor which includes a channel in a silicon substrate or a silicon layer) can operate at higher speed than a transistor including an oxide semiconductor material (a transistor which includes a channel in an oxide semiconductor layer). Thus, by combining a transistor including a material other than an oxide semiconductor and a transistor including an oxide semiconductor material, a semiconductor device can perform operation (e.g., data reading) at sufficiently high speed. Further, a transistor including a material other than an oxide semiconductor can favorably realize a variety of circuits (e.g., a logic circuit or a driver circuit) in the semiconductor device that need to operate at high speed.

A semiconductor device having a novel feature can be realized with provision of both the transistor including a material other than an oxide semiconductor (in a broader sense, a transistor capable of operating at sufficiently high speed) and the transistor including an oxide semiconductor material (in a broader sense, a transistor whose off-state current is sufficiently low).

In the semiconductor device described in this embodiment, the transistors each including an oxide semiconductor material in the memory cells of the semiconductor device are electrically connected in series, so that a source electrode of the transistor including an oxide semiconductor material in the memory cell and a drain electrode of the transistor including an oxide semiconductor material in the adjacent memory cell can be in contact with each other or used in common between the adjacent memory cells. Here, in the case where the transistors each including an oxide semiconductor material in the memory cells are not electrically connected in series, for example, it is necessary to provide an opening in an interlayer insulating film or the like so that the source electrodes or the drain electrodes of the transistors can be connected to a wiring provided in a layer which is different from layers in which the source electrodes or the drain electrodes are provided. Thus, an area needed for connection of wirings is increased in the memory cells. In contrast, in the case where the transistors each including an oxide semiconductor material are electrically connected in series between the plurality of memory cells as in the semiconductor device according to the disclosed invention, a source electrode of the transistor including an oxide semiconductor material in the memory cell and a drain electrode of the transistor including an oxide semiconductor material in the adjacent memory cell can be in contact with each other or used in common between the adjacent memory cells; thus, the area of one memory cell can be reduced. Accordingly, the semiconductor device can be highly integrated and storage capacity per unit area can be increased.

In the semiconductor device described in this embodiment, when driver circuits such as AND circuits or OR circuits are connected to the gate electrodes of the transistors 162 in the memory cells, the transistors 162 in the memory cells to which data is written can be turned on and all the transistors 162 that are connected to the bit line in the memory cells to which data is written can be turned on. In other words, it is possible to write data sequentially from the memory cell which is most distant from the bit line BL to the memory cell which is closest to the bit line BL.

Here, a transistor including an oxide semiconductor material (a transistor which includes a channel in an oxide semiconductor layer) is used as each of the transistors 162 in the memory cells 190 in the first to m-th rows, for example. The off-state current of the transistor 162 including an oxide semiconductor material is extremely low. Thus, when the transistors 162 in the memory cells 190 in the first to m-th rows are turned off, the potentials of the gate electrodes of the transistors 160 in the memory cells 190 in the first to m-th rows can be held for an extremely long time.

Note that a transistor including any material may be used as each of the transistors 160 in the memory cells 190 in the first to m-th rows, and there is no particular limitation on the transistor 160. In order to increase the speed of reading data, it is preferable to use, for example, a transistor with high switching speed, such as a transistor formed using single crystal silicon (a transistor which includes a channel in a single crystal silicon substrate or a single crystal silicon layer) as the transistor 160.

The driver circuit for outputting signals to the signal lines has the structure described in this embodiment. That is, the driver circuit generates a signal to be output to a j-th signal line with the use of a signal to be output to the (j−1)th signal line. In this manner, a driver circuit with a simple structure can generate a signal with which all the transistors 162 connected between the memory cells in the j-th row and the bit line BL (the transistors 162 in the memory cells 190 in the first to (j−1)th rows) are turned on when the transistors 162 in the memory cells 190 that are distant from the bit lines (the memory cells in the j-th row) are turned on.

Thus, the number of elements in the driver circuit can be decreased, and the power of the semiconductor device can be reduced.

As described above, the structures, methods, and the like described in this embodiment can be combined with any of the structures, methods, and the like described in the other embodiments as appropriate.

(Embodiment 2)

In this embodiment, different circuit structures and operation of semiconductor devices according to one embodiment of the disclosed invention are described with reference to FIG. 8 and FIG. 9. Note that in some circuit diagrams, "OS" is written beside a transistor in order to indicate that the transistor includes an oxide semiconductor material.

<Two-Bit Memory+Driver Circuit+Delay Circuit>

A structure which is different from the structure in FIG. 5B, in which the two transistors 162 each including an oxide semiconductor material are electrically connected in series in a column direction and circuits are connected to the signal lines S, is described with reference to FIG. 8. In a circuit diagram illustrated in FIG. 8, description of portions that are similar to those in FIG. 5B is omitted.

An output from the second AND circuit 610 is input to a second delay circuit 710, and an output from the second delay circuit 710 is input to the second signal line S_2. In addition, an output from the first OR circuit 620 is input to a first delay circuit 710, and an output from the first delay circuit 710 is input to the first signal line S_1.

In the circuit structure in FIG. 5B, the transistor 162 in the memory cell 190 in the first row is turned on after the transistor 162 in the memory cell 190 in the second row is turned on; thus, a difference is generated between timing of turning on the transistor 162 in the memory cell 190 in the second row and timing of turning on the transistor 162 in the memory cell 190 in the first row. Accordingly, by addition of the delay circuits 710, the difference between the timing of turning on the transistor 162 in the memory cell 190 in the first row and the timing of turning on the transistor 162 in the memory cell 190 in the second row can be eliminated.

<Plurality of Memories+Driver Circuits+Delay Circuits>

Figure 8:
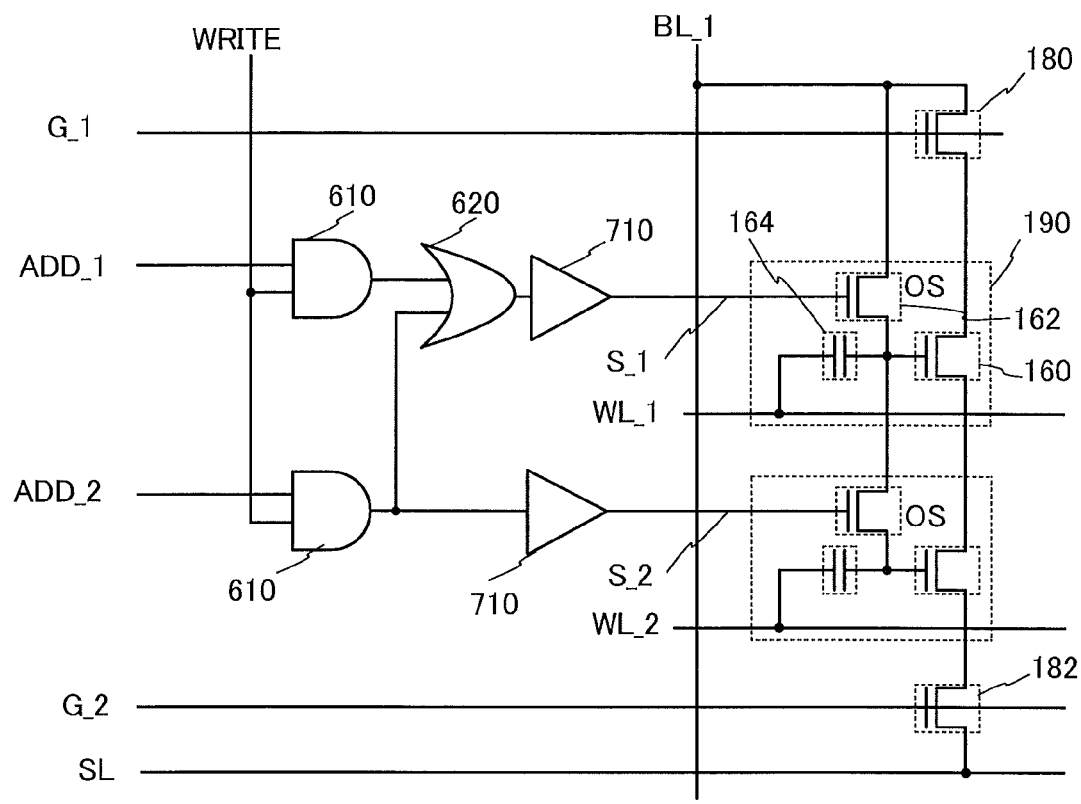
FIG. 8 is a circuit diagram of a semiconductor device.

Next, a circuit structure to which the circuit illustrated in FIG. 8 is applied and operation of the circuit are described with reference to FIG. 9. The circuit illustrated in FIG. 9 is obtained by addition of the delay circuits 710 to the circuit structure illustrated in FIG. 6. Since data is written from the memory cell that is most distant from the bit line in the circuit structure illustrated in FIG. 6, a difference is generated between timings of turning on the transistors 162 in the memory cells 190 in the first to m-th rows. Accordingly, by using the delay circuits 710, the difference between the timings of turning on the transistors 162 in the memory cells 190 in the first to m-th rows can be eliminated.

Figure 9:
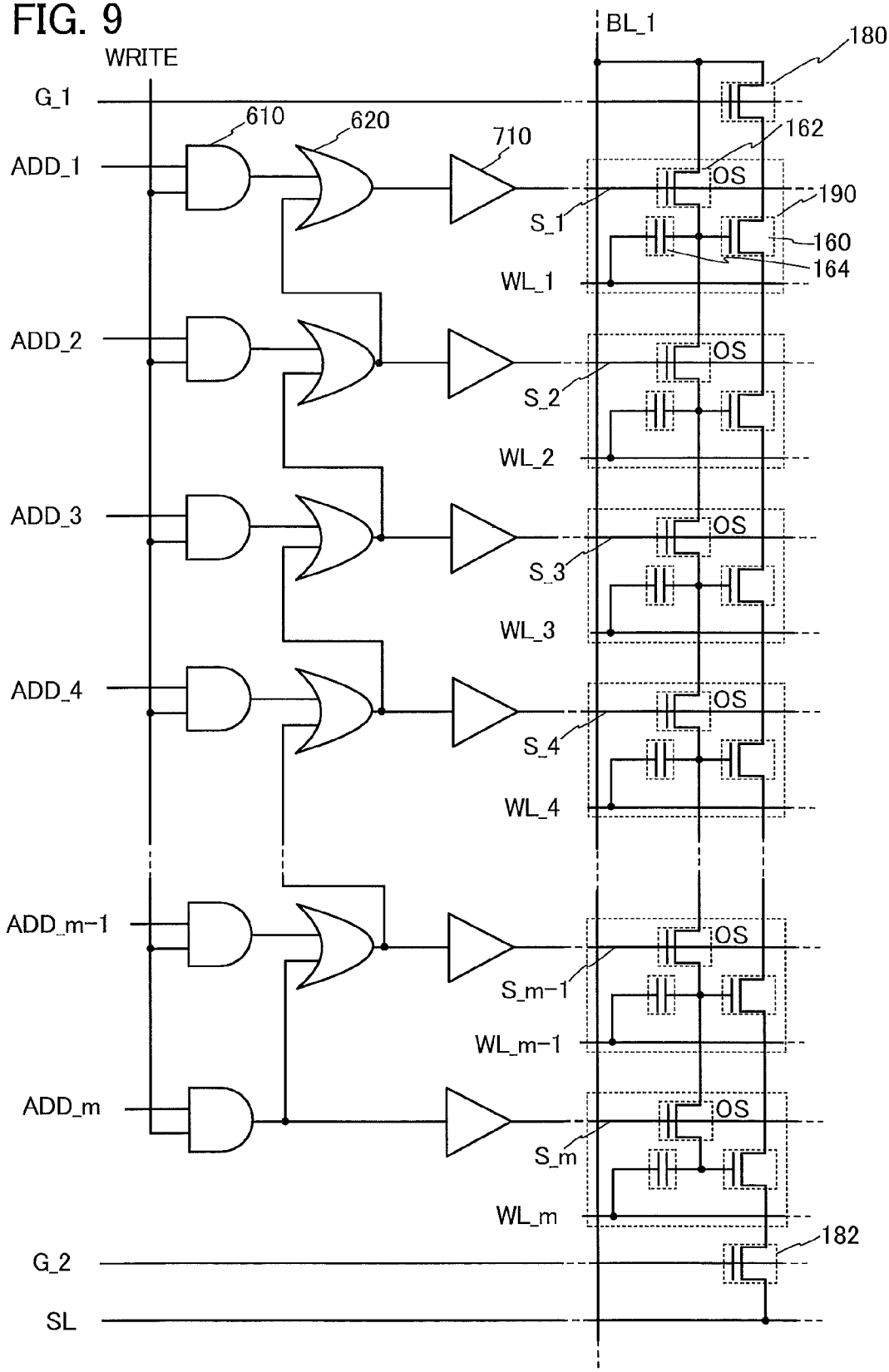
FIG. 9 is a circuit diagram of a semiconductor device.

FIG. 9 is an example of a circuit diagram of a NAND semiconductor device including m (m is a natural number of 3 or more) rows (in a vertical direction)×n (n is a natural number) columns (in a horizontal direction) memory cells 190. Note that actually, the NAND semiconductor device can include a plurality of sets of m rows (in the vertical direction)×n columns (in the horizontal direction) cells. In FIG. 9, in the case where a plurality of wirings have similar functions, the wirings are distinguished by "_1", "_2", and the like added to the end of their names. Note that in the circuit diagram illustrated in FIG. 9, the description in FIG. 2 may be referred to for the structure of the memory cells 190 in FIG. 9, and the description in FIG. 6 may be referred to for a circuit structure in FIG. 9 that is the same as the circuit structure in FIG. 6; thus, detailed description thereof is omitted.

An output from an m-th AND circuit 610 is input to an m-th delay circuit 710, and an output from the m-th delay circuit 710 is input to an m-th signal line S_m.

In addition, an output from the (j−1)th OR circuit 620 is input to a (j−1)th delay circuit 710, and an output from the (j−1)th delay circuit 710 is input to the (j−1)th signal line S_(j−1).

As illustrated in FIG. 9, the transistors 162 in the memory cells 190 are electrically connected in series, so that the area of the memory cells 190 can be reduced. For example, the area of the memory cell 190 can be 6 to 12 $F^2$ assuming that the minimum feature size is F. Accordingly, the semiconductor device can be highly integrated, and storage capacity per unit area can be increased.

Note that the selection line G_1, the selection line G_2, the selection transistors 180, and the selection transistors 182 are not necessarily provided. It is possible not to provide the selection line G_1 and the selection transistors 180. Alternatively, it is possible not to provide the selection line G_2 and the transistors 182.

In the structure illustrated in FIG. 9, for data writing and data reading, the description in FIG. 2 may be referred to; thus, detailed description thereof is omitted. For operations of the AND circuit 610 and the OR circuit 620 at the time of writing data in the structure illustrated in FIG. 9, the description in FIG. 6 may be referred to; thus, detailed description thereof is omitted.

By using the delay circuits 710 in this manner, the difference between the timings of turning on the transistors 162 in the memory cells 190 in the first to m-th rows can be eliminated. Note that as the delay circuit, for example, a circuit in which inverter circuits are connected in series can be used.

In the semiconductor device described in this embodiment, with the use of a transistor which includes a channel in an oxide semiconductor layer in each memory cell, the outflow of electrical charge from a capacitor or the inflow of electrical charge into the capacitor at the time when the transistor is not selected can be suppressed because the transistor has extremely low off-state current. Accordingly, the semiconductor device can retain stored data for an extremely long time. In other words, refresh operation in the semiconductor device is not needed or the frequency of the refresh operation can be extremely decreased, which leads to a sufficient reduction in power consumption. Further, the semiconductor device can retain stored data for a long time even when power is not supplied (a potential applied to the semiconductor device is preferably not changed between the case where power is not supplied and the case where power is supplied).

Further, the semiconductor device described in this embodiment does not need high voltage for writing data to each memory cell, so that elements included in the semiconductor device are less likely to deteriorate. For example, in a conventional flash memory, electrons are injected into and extracted from a floating gate; thus, it is necessary to apply high voltage to an element such as a floating-gate transistor included in a semiconductor device. Thus, the problem of deterioration of a gate insulating layer of the transistor occurs. However, unlike the conventional flash memory, it is not necessary to apply high voltage to an element such as a transistor included in the semiconductor device according to the disclosed invention; thus, a gate insulating layer of the transistor is less likely to deteriorate. In other words, the semiconductor device according to the disclosed invention does not have the limitation on the number of writing, which is a problem of a conventional non-volatile memory device, and reliability thereof is markedly improved. Furthermore, data is written to each memory cell by control of the on and off of the transistor included in the semiconductor device, so that the high-speed operation of the semiconductor device can be easily realized.

In addition, a transistor including a material other than an oxide semiconductor (e.g., a transistor which includes a channel in a silicon substrate or a silicon layer) can operate at higher speed than a transistor including an oxide semiconductor material (a transistor which includes a channel in an oxide semiconductor layer). Thus, by combining a transistor including a material other than an oxide semiconductor and a transistor including an oxide semiconductor material, a semiconductor device can perform operation (e.g., data reading) at sufficiently high speed. Further, a transistor including a material other than an oxide semiconductor can favorably realize a variety of circuits (e.g., a logic circuit or a driver circuit) in the semiconductor device that need to operate at high speed.

A semiconductor device having a novel feature can be realized with provision of both the transistor including a material other than an oxide semiconductor (in a broader sense, a transistor capable of operating at sufficiently high speed) and the transistor including an oxide semiconductor material (in a broader sense, a transistor whose off-state current is sufficiently low).

In the semiconductor device described in this embodiment, the transistors each including an oxide semiconductor material in the memory cells of the semiconductor device are electrically connected in series, so that a source electrode of the transistor including an oxide semiconductor material in the memory cell and a drain electrode of the transistor including an oxide semiconductor material in the adjacent memory cell can be in contact with each other or used in common between the adjacent memory cells. Here, in the case where the transistors each including an oxide semiconductor material in the memory cells are not electrically connected in series, for example, it is necessary to provide an opening in an interlayer insulating film or the like so that the source electrodes or the drain electrodes of the transistors can be connected to a wiring provided in a layer which is different from layers in which the source electrodes or the drain electrodes are provided. Thus, an area needed for connection of wirings is increased in the memory cells. In contrast, in the case where the transistors each including an oxide semiconductor material are electrically connected in series between the plurality of memory cells as in the semiconductor device according to the disclosed invention, a source electrode of the transistor including an oxide semiconductor material in the memory cell and a drain electrode of the transistor including an oxide semiconductor material in the adjacent memory cell can be in contact with each other or used in common between the adjacent memory cells; thus, the area of one memory cell can be reduced. Accordingly, the semiconductor device can be highly integrated and storage capacity per unit area can be increased.

In the semiconductor device described in this embodiment, when driver circuits such as AND circuits or OR circuits are connected to the gate electrodes of the transistors 162 in the memory cells, the transistors 162 in the memory cells to which data is written can be turned on and all the transistors 162 that are connected to the bit line in the memory cells to which data is written can be turned on. In other words, it is possible to write data sequentially from the memory cell which is most distant from the bit line BL to the memory cell which is closest to the bit line BL.

Here, a transistor including an oxide semiconductor material (a transistor which includes a channel in an oxide semiconductor layer) is used as each of the transistors 162 in the memory cells 190 in the first to m-th rows, for example. The off-state current of the transistor 162 including an oxide semiconductor material is extremely low. Thus, when the transistors 162 in the memory cells 190 in the first to m-th rows are turned off, the potentials of the gate electrodes of the transistors 160 in the memory cells 190 in the first to m-th rows can be held for an extremely long time.

Note that a transistor including any material may be used as each of the transistors 160 in the memory cells 190 in the first to m-th rows, and there is no particular limitation on the transistor 160. In order to increase the speed of reading data, it is preferable to use, for example, a transistor with high switching speed, such as a transistor formed using single crystal silicon (a transistor which includes a channel in a single crystal silicon substrate or a single crystal silicon layer) as the transistor 160.

The driver circuit for outputting signals to the signal lines has the structure described in this embodiment. That is, the driver circuit generates a signal to be output to the j-th signal line with the use of a signal to be output to the (j−1)th signal line. In this manner, a driver circuit with a simple structure can generate a signal with which all the transistors 162 connected between the memory cells 190 in the j-th row and the bit line BL (the transistors 162 in the memory cells in the first to (j−1)th rows) are turned on when the transistors 162 in the memory cells 190 that are distant from the bit lines BL (the memory cells 190 in the j-th row) are turned on.

Thus, the number of elements in the driver circuit can be decreased, and the power of the semiconductor device can be reduced.

In the semiconductor device described in this embodiment, with provision of the delay circuit 710 between the m-th AND circuit 610 and the m-th signal line S_m or between the (j−1)th OR circuit 620 and the (j−1)th signal line S_(j−1), the difference between the timings of turning on the transistors 162 in the memory cells 190 in the first to m-th rows can be eliminated. Thus, the transistors 162 in the memory cells 190 in the first to m-th rows can be turned on at the same time.

As described above, the structures, methods, and the like described in this embodiment can be combined with any of the structures, methods, and the like described in the other embodiments as appropriate.

(Embodiment 3)

In this embodiment, different circuit structures and operation of semiconductor devices according to one embodiment of the disclosed invention are described with reference to FIG. 10, FIG. 11, and FIG. 12. Note that in some circuit diagrams, "OS" is written beside a transistor in order to indicate that the transistor includes an oxide semiconductor material.

<Two-Bit Memory+Driver Circuits+Delay Circuits+Level Shifters>

A structure which is different from the structure in FIG. 8, in which the two transistors 162 each including an oxide semiconductor material are electrically connected in series in a column direction and circuits are connected to the signal lines S, is described with reference to FIG. 10. In a circuit diagram illustrated in FIG. 10, description of portions that are similar to those in FIG. 8 is omitted.

The output from the second delay circuit 710 is input to a second level shifter 900, and an output from the second level shifter 900 is input to the signal line S_2. An output from the first delay circuit is input to a first level shifter 900, and an output from the first level shifter 900 is input to the signal line S_1.

Figure 10:
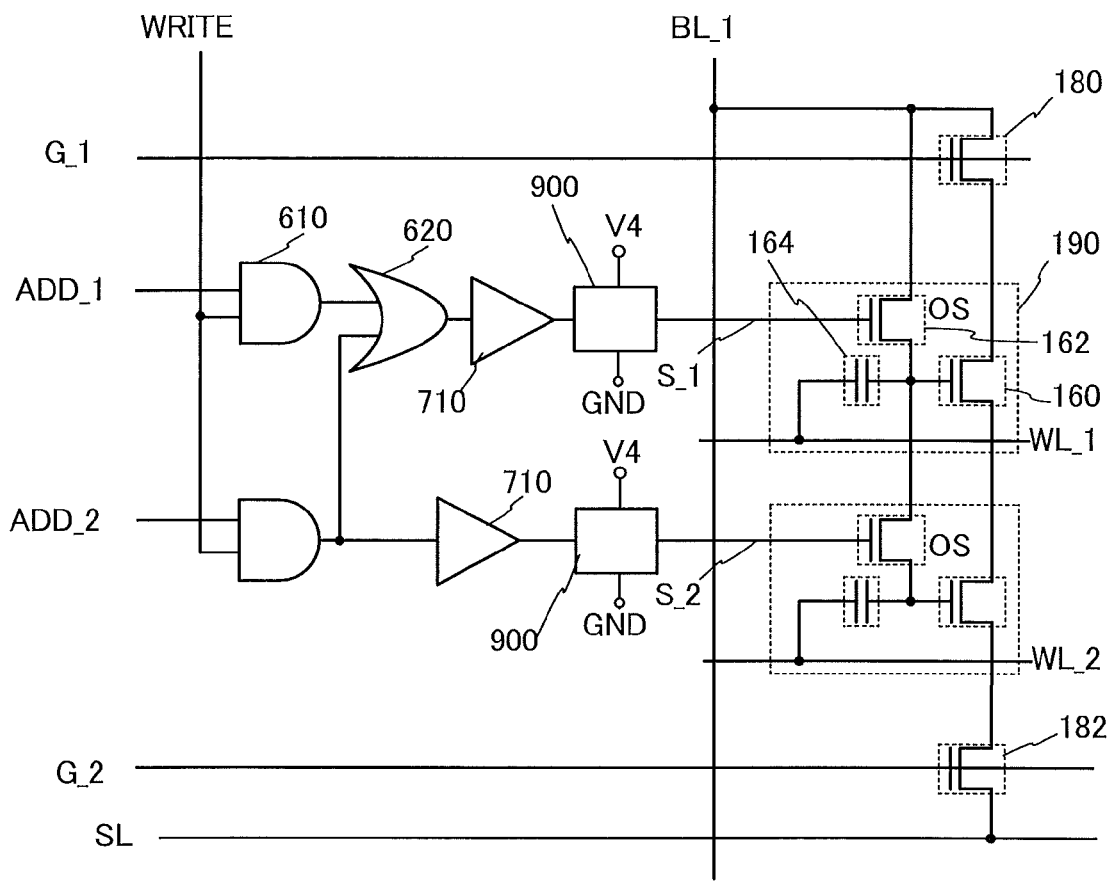
FIG. 10 is a circuit diagram of a semiconductor device.
Figure 11:
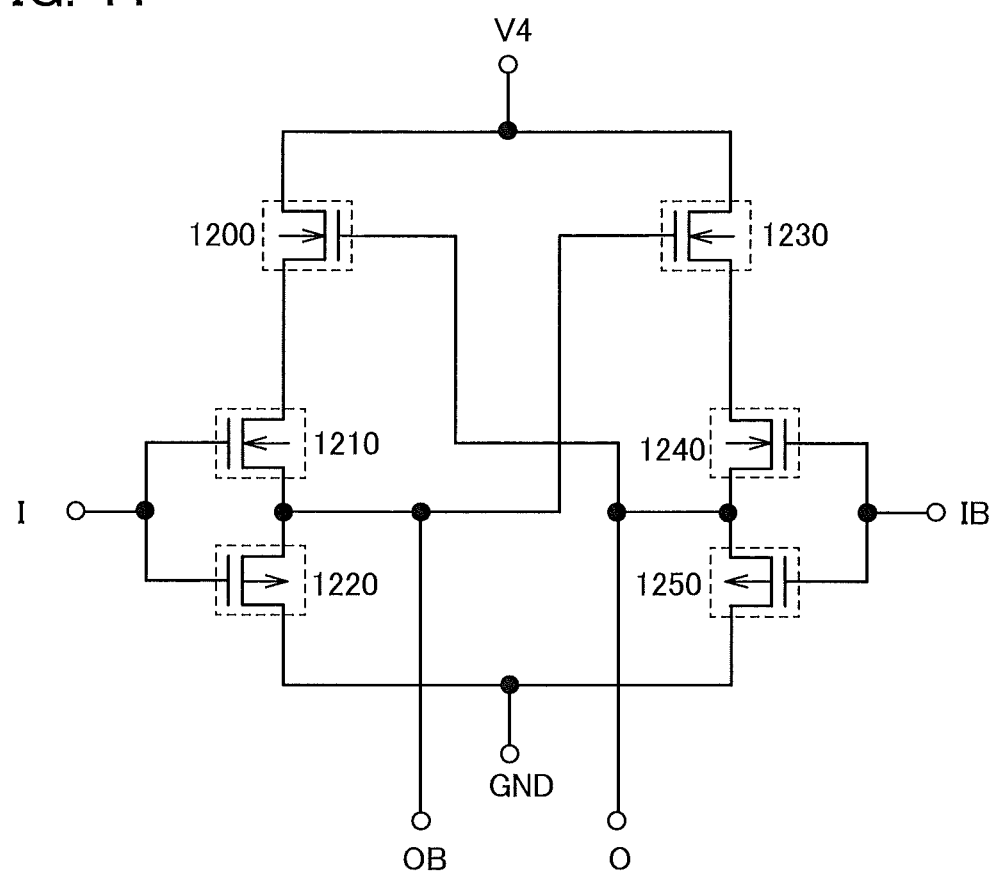
FIG. 11 is a circuit diagram of a semiconductor device.

FIG. 11 illustrates a structure example of the level shifter 900 illustrated in FIG. 10. The level shifter illustrated in FIG. 11 has the following structure. A source terminal of a first p-channel transistor 1200 and a source terminal of a third p-channel transistor 1230 are electrically connected to a power source which supplies the potential V4. A drain terminal of the first p-channel transistor 1200 is electrically connected to a source terminal of a second p-channel transistor 1210, and a drain terminal of the third p-channel transistor 1230 is electrically connected to a source terminal of a fourth p-channel transistor 1240. A drain terminal of the second p-channel transistor 1210 is electrically connected to a drain terminal of a first n-channel transistor 1220 and a gate terminal of the third p-channel transistor 1230, and a drain terminal of the fourth p-channel transistor 1240 is electrically connected to a drain terminal of a second n-channel transistor 1250 and a gate terminal of the first p-channel transistor 1200. GND (0 V) is applied to a source terminal of the first n-channel transistor 1220 and a source terminal of the second n-channel transistor 1250.

In FIG. 11, an input signal I is input to a gate terminal of the second p-channel transistor 1210 and a gate terminal of the first n-channel transistor 1220, and an inverted input signal IB is input to a gate terminal of the fourth p-channel transistor 1240 and a gate terminal of the second n-channel transistor 1250. An output signal O is obtained from the drain terminal of the fourth p-channel transistor 1240. In addition, an inverted output signal OB can be obtained from the drain terminal of the second p-channel transistor 1210.

The basic operation of the level shifter illustrated in FIG. 11 is described. When the input signal I is high, the first n-channel transistor 1220 is turned on. Thus, the potential GND is input to the gate terminal of the third p-channel transistor 1230, and the third p-channel transistor 1230 is turned on. In addition, the inverted output signal OB is Low. Low at this time is equal to GND. On the other hand, the inverted input signal IB at this time is low. Thus, the fourth p-channel transistor 1240 is turned on, and the second n-channel transistor 1250 is turned off. Here, the third p-channel transistor 1230 and the fourth p-channel transistor 1240 are turned on. Thus, the output signal O is high (V4).

When the potential of the input signal I is low, the operation can be understood in a manner similar to the above because the level shifter illustrated in FIG. 11 has a symmetric structure; the output signal O is low, and the potential of the output signal at this time is GND.

In this manner, the output signal (O) whose amplitude is converted with respect to the input signal can be obtained.

As described above, with provision of the level shifter 900 between the delay circuit 710 and the signal line S, voltage on the memory cell 190 side (e.g., voltage of the signal line S or the bit line) and voltage on the driver circuit side (e.g., the AND circuit 610 or the OR circuit 620) can be converted through the level shifter.

<Plurality of Memories+Driver Circuits+Delay Circuits+Level Shifters>

Next, a circuit structure to which the circuit illustrated in FIG. 10 is applied and operation of the circuit are described with reference to FIG. 12. The circuit illustrated in FIG. 12 is obtained by addition of the level shifters 900 to the circuit structure illustrated in FIG. 8. In the circuit structure illustrated in FIG. 8, voltage for writing data to the memory cell 190 and voltage for driving the driver circuit are at the same level. Thus, with provision of the level shifter between the delay circuit 710 and the signal line S, the voltage for driving the driver circuit and the voltage for writing data to the memory cell 190 can be converted.

Figure 12:
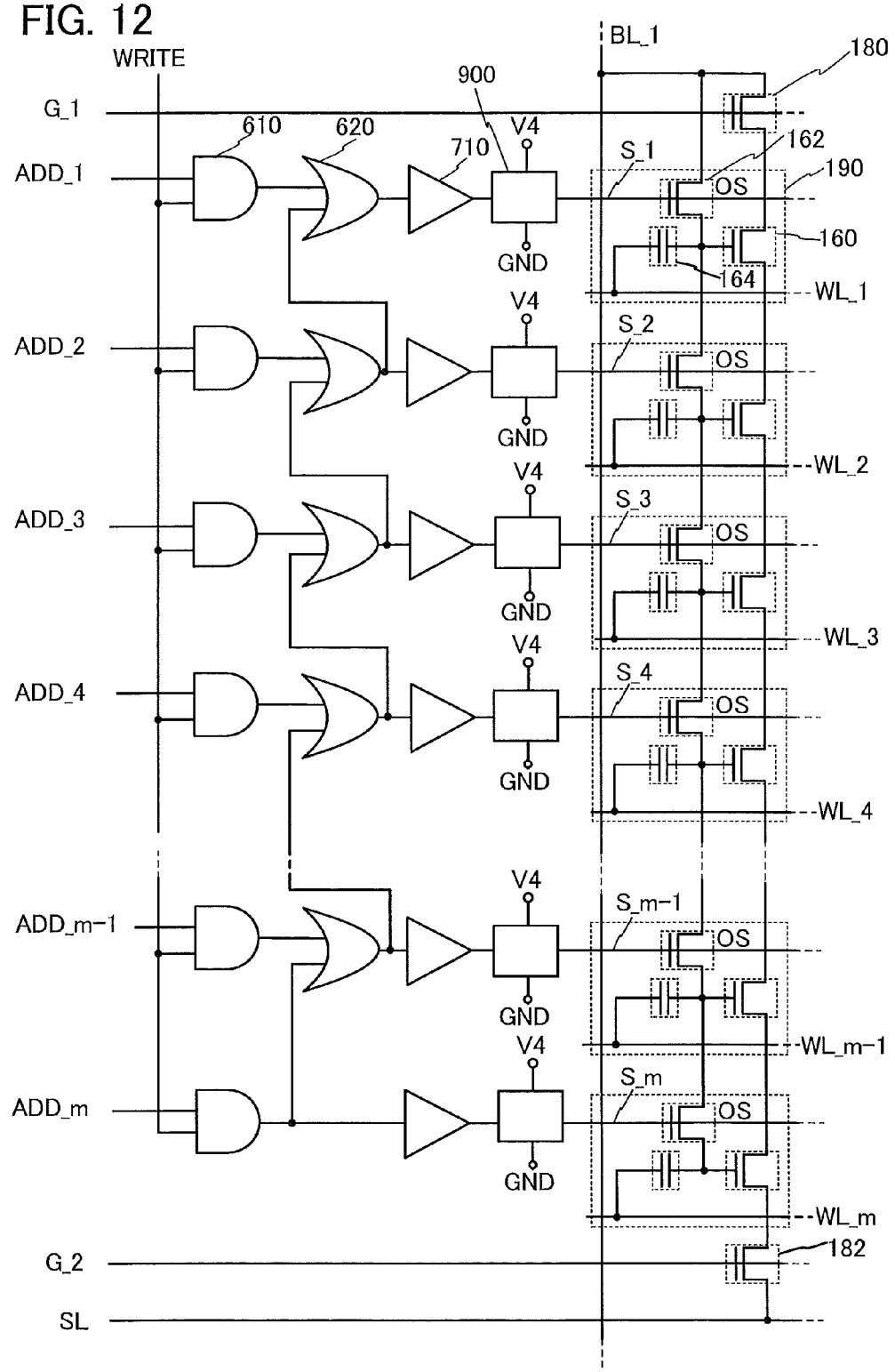
FIG. 12 is a circuit diagram of a semiconductor device.

FIG. 12 is an example of a circuit diagram of a NAND semiconductor device including m (m is a natural number of 3 or more) rows (in a vertical direction)×n (n is a natural number) columns (in a horizontal direction) memory cells 190. Note that actually, the NAND semiconductor device can include a plurality of sets of m rows (in the vertical direction)×n columns (in the horizontal direction) cells. In FIG. 12, in the case where a plurality of wirings have similar functions, the wirings are distinguished by "_1", "_2", and the like added to the end of their names. Note that in the circuit diagram illustrated in FIG. 12, the description in FIG. 2 may be referred to for the structure of the memory cells 190 in FIG. 12, and the description in FIG. 9 may be referred to for a circuit structure in FIG. 12 that is the same as the circuit structure in FIG. 9; thus, detailed description thereof is omitted.

The output from the m-th delay circuit 710 is input to an m-th level shifter 900, and an output from the m-th level shifter 900 is input to the m-th signal line S_m.

As illustrated in FIG. 12, the transistors 162 in the memory cells 190 are electrically connected in series, so that the area of the memory cells 190 can be reduced. For example, the area of the memory cell 190 can be 6 to 12 $F^2$ assuming that the minimum feature size is F. Accordingly, the semiconductor device can be highly integrated, and storage capacity per unit area can be increased.

Note that the selection line G_1, the selection line G_2, the selection transistors 180, and the selection transistors 182 are not necessarily provided. It is possible not to provide the selection line G_1 and the selection transistors 180. Alternatively, it is possible not to provide the selection line G_2 and the transistors 182.

In the structure illustrated in FIG. 12, for data writing and data reading, the description in FIG. 2 may be referred to; thus, detailed description thereof is omitted. For operations of the AND circuit 610 and the OR circuit 620 at the time of writing data in the structure illustrated in FIG. 12, the description in FIG. 6 may be referred to; thus, detailed description thereof is omitted. In the structure illustrated in FIG. 12, for operation of the delay circuit 710, the description in FIG. 9 may be referred to; thus, detailed description thereof is omitted. In the structure illustrated in FIG. 12, for operation of the level shifter 900, the description in FIG. 10 and the description in FIG. 11 may be referred to; thus, detailed description thereof is omitted.

As described above, by using the level shifter 900, voltage on the memory cell 190 side (e.g., voltage of the signal line S or the bit line) and voltage on the driver circuit side (e.g., the AND circuit 610 or the OR circuit 620) can be converted through the level shifter.

In the semiconductor device described in this embodiment, with the use of a transistor which includes a channel in an oxide semiconductor layer in each memory cell, the outflow of electrical charge from a capacitor or the inflow of electrical charge into the capacitor at the time when the transistor is not selected can be suppressed because the transistor has extremely low off-state current. Accordingly, the semiconductor device can retain stored data for an extremely long time. In other words, refresh operation in the semiconductor device is not needed or the frequency of the refresh operation can be extremely decreased, which leads to a sufficient reduction in power consumption. Further, the semiconductor device can retain stored data for a long time even when power is not supplied (a potential applied to the semiconductor device is preferably not changed between the case where power is not supplied and the case where power is supplied).

Further, the semiconductor device described in this embodiment does not need high voltage for writing data to each memory cell, so that elements included in the semiconductor device are less likely to deteriorate. For example, in a conventional flash memory, electrons are injected into and extracted from a floating gate; thus, it is necessary to apply high voltage to an element such as a floating-gate transistor included in a semiconductor device. Thus, the problem of deterioration of a gate insulating layer of the transistor occurs. However, unlike the conventional flash memory, it is not necessary to apply high voltage to an element such as a transistor included in the semiconductor device according to the disclosed invention; thus, a gate insulating layer of the transistor is less likely to deteriorate. In other words, the semiconductor device according to the disclosed invention does not have the limitation on the number of writing, which is a problem of a conventional non-volatile memory device, and reliability thereof is markedly improved. Furthermore, data is written to each memory cell by control of the on and off of the transistor included in the semiconductor device, so that the high-speed operation of the semiconductor device can be easily realized.

In addition, a transistor including a material other than an oxide semiconductor (e.g., a transistor which includes a channel in a silicon substrate or a silicon layer) can operate at higher speed than a transistor including an oxide semiconductor material (a transistor which includes a channel in an oxide semiconductor layer). Thus, by combining a transistor including a material other than an oxide semiconductor and a transistor including an oxide semiconductor material, a semiconductor device can perform operation (e.g., data reading) at sufficiently high speed. Further, a transistor including a material other than an oxide semiconductor can favorably realize a variety of circuits (e.g., a logic circuit or a driver circuit) in the semiconductor device that need to operate at high speed.

A semiconductor device having a novel feature can be realized with provision of both the transistor including a material other than an oxide semiconductor (in a broader sense, a transistor capable of operating at sufficiently high speed) and the transistor including an oxide semiconductor material (in a broader sense, a transistor whose off-state current is sufficiently low).

In the semiconductor device described in this embodiment, the transistors each including an oxide semiconductor material in the memory cells of the semiconductor device are electrically connected in series, so that a source electrode of the transistor including an oxide semiconductor material in the memory cell and a drain electrode of the transistor including an oxide semiconductor material in the adjacent memory cell can be in contact with each other or used in common between the adjacent memory cells. Here, in the case where the transistors each including an oxide semiconductor material in the memory cells are not electrically connected in series, for example, it is necessary to provide an opening in an interlayer insulating film or the like so that the source electrodes or the drain electrodes of the transistors can be connected to a wiring provided in a layer which is different from layers in which the source electrodes or the drain electrodes are provided. Thus, an area needed for connection of wirings is increased in the memory cells. In contrast, in the case where the transistors each including an oxide semiconductor material are electrically connected in series between the plurality of memory cells as in the semiconductor device according to the disclosed invention, a source electrode of the transistor including an oxide semiconductor material in the memory cell and a drain electrode of the transistor including an oxide semiconductor material in the adjacent memory cell can be in contact with each other or used in common between the adjacent memory cells; thus, the area of one memory cell can be reduced. Accordingly, the semiconductor device can be highly integrated and storage capacity per unit area can be increased.

In the semiconductor device described in this embodiment, when driver circuits such as AND circuits or OR circuits are connected to the gate electrodes of the transistors 162 in the memory cells, the transistors 162 in the memory cells to which data is written can be turned on and all the transistors 162 that are connected to the bit line in the memory cells to which data is written can be turned on. In other words, it is possible to write data sequentially from the memory cell which is most distant from the bit line BL to the memory cell which is closest to the bit line BL.

Here, a transistor including an oxide semiconductor material (a transistor which includes a channel in an oxide semiconductor layer) is used as each of the transistors 162 in the memory cells 190 in the first to m-th rows, for example. The off-state current of the transistor 162 including an oxide semiconductor material is extremely low. Thus, when the transistors 162 in the memory cells 190 in the first to m-th rows are turned off, the potentials of the gate electrodes of the transistors 160 in the memory cells 190 in the first to m-th rows can be held for an extremely long time.

Note that a transistor including any material may be used as each of the transistors 160 in the memory cells 190 in the first to m-th rows, and there is no particular limitation on the transistor 160. In order to increase the speed of reading data, it is preferable to use, for example, a transistor with high switching speed, such as a transistor formed using single crystal silicon (a transistor which includes a channel in a single crystal silicon substrate or a single crystal silicon layer) as the transistor 160.

The driver circuit for outputting signals to the signal lines has the structure described in this embodiment. That is, the driver circuit generates a signal to be output to the j-th signal line with the use of a signal to be output to the (j−1)th signal line. In this manner, a driver circuit with a simple structure can generate a signal with which all the transistors 162 connected between the memory cells 190 in the j-th row and the bit line BL (the transistors 162 in the memory cells in the first to (j−1)th rows) are turned on when the transistors 162 in the memory cells 190 that are distant from the bit lines BL (the memory cells 190 in the j-th row) are turned on.

Thus, the number of elements in the driver circuit can be decreased, and the power of the semiconductor device can be reduced.

In the semiconductor device described in this embodiment, with provision of the delay circuit 710 between the m-th AND circuit 610 and the m-th signal line S_m or between the (j−1)th OR circuit 620 and the (j−1)th signal line S_(j−1), the difference between the timings of turning on the transistors 162 in the memory cells 190 in the first to m-th rows can be eliminated. Thus, the transistors 162 in the memory cells 190 in the first to m-th rows can be turned on at the same time.

In the semiconductor device described in this embodiment, with provision of the level shifter 900 between the delay circuit 710 and the signal line S, the voltage for driving the driver circuit and the voltage for writing data to the memory cell 190 can be converted.

As described above, the structures, methods, and the like described in this embodiment can be combined with any of the structures, methods, and the like described in the other embodiments as appropriate.

(Embodiment 4)

In this embodiment, different circuit structures and operation of semiconductor devices according to one embodiment of the disclosed invention are described with reference to FIG. 13 and FIG. 14. Note that in some circuit diagrams, "OS" is written beside a transistor in order to indicate that the transistor includes an oxide semiconductor material.

<Two-Bit Memory+Driver Circuits+SYNC>

A structure which is different from the structures in Embodiments 1 to 3, in which the two transistors 162 each including an oxide semiconductor material are electrically connected in series in a column direction and circuits are connected to the signal lines S, is described with reference to FIG. 13. In a circuit diagram illustrated in FIG. 13, the AND circuit 610 is provided instead of the delay circuit 710 in FIG. 8 and a signal line SYNC is added, so that an effect that is the same as the effect of the delay circuit 710 can be obtained. In the circuit diagram illustrated in FIG. 13, description of portions that are similar to those in FIG. 8 is omitted.

The output from the second AND circuit 610 to which the write control signal WRITE is input (the second first AND circuit) and a signal from the signal line SYNC are input to the second AND circuit 610 to which the signal from the signal line SYNC is input (the second second AND circuit). An output from the second second AND circuit is input to the signal line S_2. The output from the first OR circuit 620 and the signal from the signal line SYNC are input to the first AND circuit 610 to which the signal from the signal line SYNC is input (the first second AND circuit).

The AND circuit is provided instead of the delay circuit 710 in FIG. 8 and the signal from the signal line SYNC is input to the AND circuit, so that the signal from the signal line SYNC can be output to the signal line S_1 and the signal line S_2 at the same time. Thus, the difference between the timing of turning on the transistor 162 in the memory cell 190 in the first row and the timing of turning on the transistor 162 in the memory cell 190 in the second row can be eliminated.

<Plurality of Memories+Driver Circuits+SYNC>

Figure 13:
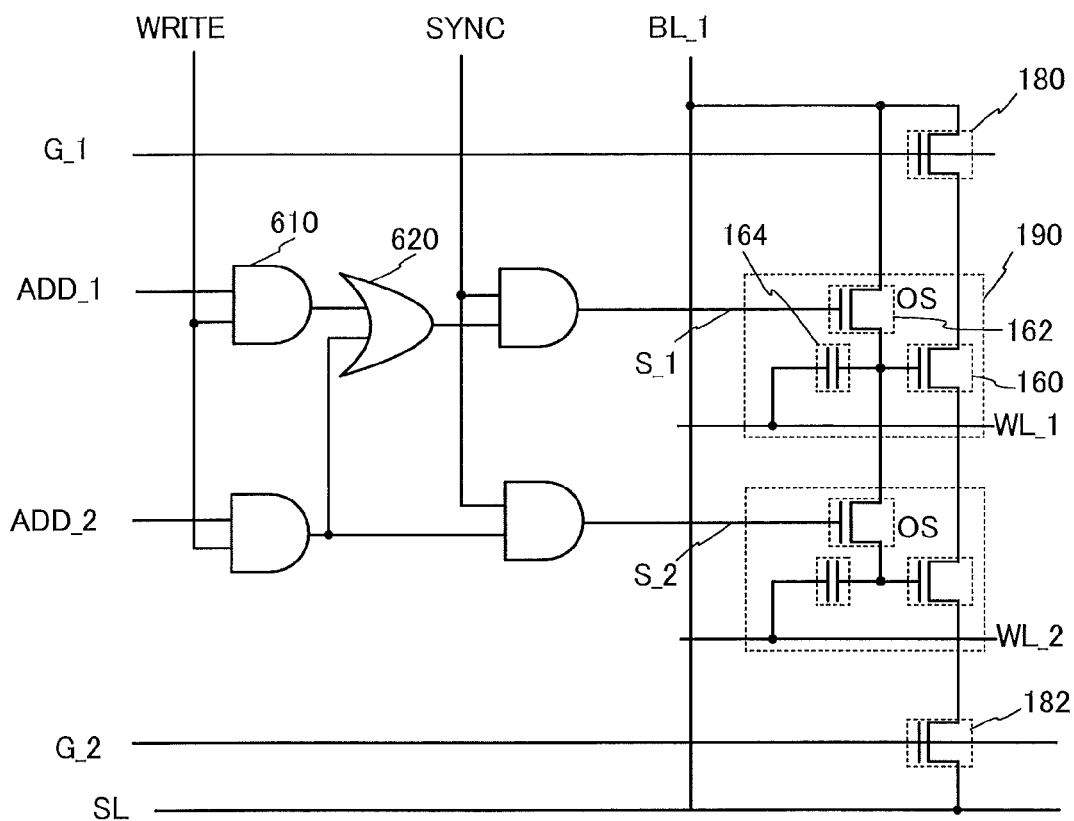
FIG. 13 is a circuit diagram of a semiconductor device.

Next, a circuit structure to which the circuit illustrated in FIG. 13 is applied and operation of the circuit are described with reference to FIG. 14. In a circuit diagram illustrated in FIG. 14, the AND circuit is provided instead of the delay circuit 710 in the circuit structure illustrated in FIG. 9 and the signal line SYNC is added. In FIG. 9, by using the delay circuits 710, the difference between the timings of turning on the transistors 162 in the memory cells 190 in the first to m-th rows is eliminated; however, in FIG. 14, by output of the signal from the signal line SYNC to the signal lines S at the same time, the difference between the timings of turning on the transistors 162 in the memory cells 190 in the first to m-th rows is eliminated.

Figure 14:
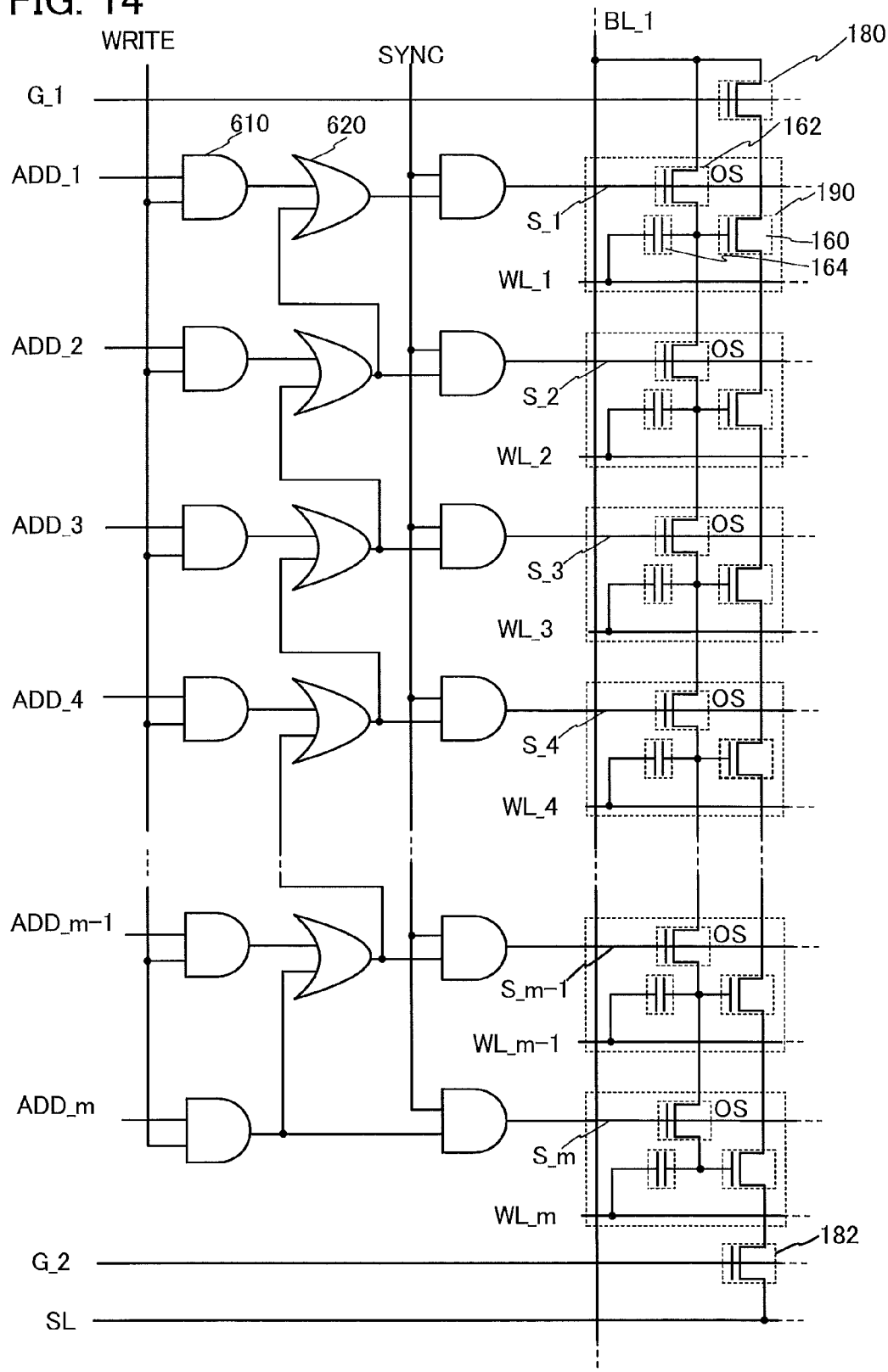
FIG. 14 is a circuit diagram of a semiconductor device.

FIG. 14 is an example of a circuit diagram of a NAND semiconductor device including m (m is a natural number of 3 or more) rows (in a vertical direction)×n (n is a natural number) columns (in a horizontal direction) memory cells 190. Note that actually, the NAND semiconductor device can include a plurality of sets of m rows (in the vertical direction)×n columns (in the horizontal direction) cells. In FIG. 14, in the case where a plurality of wirings have similar functions, the wirings are distinguished by "_1", "_2", and the like added to the end of their names. Note that in the circuit diagram illustrated in FIG. 14, the description in FIG. 2 may be referred to for the structure of the memory cells 190 in FIG. 14, and the description in FIG. 6 may be referred to for a circuit structure in FIG. 14 that is the same as the circuit structure in FIG. 6; thus, detailed description thereof is omitted.

An output from the m-th AND circuit 610 to which the write control signal WRITE is input (an m-th first AND circuit) and the signal from the signal line SYNC are input to the m-th AND circuit 610 to which the signal from the signal line SYNC is input (an m-th second AND circuit).

The output from the (j−1)th OR circuit and the signal from the signal line SYNC are input to the (j−1)th second AND circuit 610.

As illustrated in FIG. 14, the transistors 162 in the memory cells 190 are electrically connected in series, so that the area of the memory cells 190 can be reduced. For example, the area of the memory cell 190 can be 6 to 12 $F^2$ assuming that the minimum feature size is F. Accordingly, the semiconductor device can be highly integrated, and storage capacity per unit area can be increased.

Note that the selection line G_1, the selection line G_2, the selection transistors 180, and the selection transistors 182 are not necessarily provided. It is possible not to provide the selection line G_1 and the selection transistors 180. Alternatively, it is possible not to provide the selection line G_2 and the transistors 182.

In the structure illustrated in FIG. 14, for data writing and data reading, the description in FIG. 2 may be referred to; thus, detailed description thereof is omitted. For operations of the AND circuit 610 and the OR circuit 620 at the time of writing data in the structure illustrated in FIG. 14, the description in FIG. 6 may be referred to; thus, detailed description thereof is omitted.

The AND circuit is provided instead of the delay circuit 710 in FIG. 9 and the signal from the signal line SYNC is input to the AND circuit as described above, so that the signal from the signal line SYNC can be output to the signal lines S_1 to S_m at the same time. Thus, the difference between the timings of turning on the transistors 162 in the memory cells 190 in the first to m-th rows can be eliminated.

In the semiconductor device described in this embodiment, with the use of a transistor which includes a channel in an oxide semiconductor layer in each memory cell, the outflow of electrical charge from a capacitor or the inflow of electrical charge into the capacitor at the time when the transistor is not selected can be suppressed because the transistor has extremely low off-state current. Accordingly, the semiconductor device can retain stored data for an extremely long time. In other words, refresh operation in the semiconductor device is not needed or the frequency of the refresh operation can be extremely decreased, which leads to a sufficient reduction in power consumption. Further, the semiconductor device can retain stored data for a long time even when power is not supplied (a potential applied to the semiconductor device is preferably not changed between the case where power is not supplied and the case where power is supplied).

Further, the semiconductor device described in this embodiment does not need high voltage for writing data to each memory cell, so that elements included in the semiconductor device are less likely to deteriorate. For example, in a conventional flash memory, electrons are injected into and extracted from a floating gate; thus, it is necessary to apply high voltage to an element such as a floating-gate transistor included in a semiconductor device. Thus, the problem of deterioration of a gate insulating layer of the transistor occurs. However, unlike the conventional flash memory, it is not necessary to apply high voltage to an element such as a transistor included in the semiconductor device according to the disclosed invention; thus, a gate insulating layer of the transistor is less likely to deteriorate. In other words, the semiconductor device according to the disclosed invention does not have the limitation on the number of writing, which is a problem of a conventional non-volatile memory device, and reliability thereof is markedly improved. Furthermore, data is written to each memory cell by control of the on and off of the transistor included in the semiconductor device, so that the high-speed operation of the semiconductor device can be easily realized.

In addition, a transistor including a material other than an oxide semiconductor (e.g., a transistor which includes a channel in a silicon substrate or a silicon layer) can operate at higher speed than a transistor including an oxide semiconductor material (a transistor which includes a channel in an oxide semiconductor layer). Thus, by combining a transistor including a material other than an oxide semiconductor and a transistor including an oxide semiconductor material, a semiconductor device can perform operation (e.g., data reading) at sufficiently high speed. Further, a transistor including a material other than an oxide semiconductor can favorably realize a variety of circuits (e.g., a logic circuit or a driver circuit) in the semiconductor device that need to operate at high speed.

A semiconductor device having a novel feature can be realized with provision of both the transistor including a material other than an oxide semiconductor (in a broader sense, a transistor capable of operating at sufficiently high speed) and the transistor including an oxide semiconductor material (in a broader sense, a transistor whose off-state current is sufficiently low).

In the semiconductor device described in this embodiment, the transistors each including an oxide semiconductor material in the memory cells of the semiconductor device are electrically connected in series, so that a source electrode of the transistor including an oxide semiconductor material in the memory cell and a drain electrode of the transistor including an oxide semiconductor material in the adjacent memory cell can be in contact with each other or used in common between the adjacent memory cells. Here, in the case where the transistors each including an oxide semiconductor material in the memory cells are not electrically connected in series, for example, it is necessary to provide an opening in an interlayer insulating film or the like so that the source electrodes or the drain electrodes of the transistors can be connected to a wiring provided in a layer which is different from layers in which the source electrodes or the drain electrodes are provided. Thus, an area needed for connection of wirings is increased in the memory cells. In contrast, in the case where the transistors each including an oxide semiconductor material are electrically connected in series between the plurality of memory cells as in the semiconductor device according to the disclosed invention, a source electrode of the transistor including an oxide semiconductor material in the memory cell and a drain electrode of the transistor including an oxide semiconductor material in the adjacent memory cell can be in contact with each other or used in common between the adjacent memory cells; thus, the area of one memory cell can be reduced. Accordingly, the semiconductor device can be highly integrated and storage capacity per unit area can be increased.

In the semiconductor device described in this embodiment, when driver circuits such as AND circuits or OR circuits are connected to the gate electrodes of the transistors 162 in the memory cells, the transistors 162 in the memory cells to which data is written can be turned on and all the transistors 162 that are connected to the bit line in the memory cells to which data is written can be turned on. In other words, it is possible to write data sequentially from the memory cell which is most distant from the bit line BL to the memory cell which is closest to the bit line BL.

Here, a transistor including an oxide semiconductor material (a transistor which includes a channel in an oxide semiconductor layer) is used as each of the transistors 162 in the memory cells 190 in the first to m-th rows, for example. The off-state current of the transistor 162 including an oxide semiconductor material is extremely low. Thus, when the transistors 162 in the memory cells 190 in the first to m-th rows are turned off, the potentials of the gate electrodes of the transistors 160 in the memory cells 190 in the first to m-th rows can be held for an extremely long time.

Note that a transistor including any material may be used as each of the transistors 160 in the memory cells 190 in the first to m-th rows, and there is no particular limitation on the transistor 160. In order to increase the speed of reading data, it is preferable to use, for example, a transistor with high switching speed, such as a transistor formed using single crystal silicon (a transistor which includes a channel in a single crystal silicon substrate or a single crystal silicon layer) as the transistor 160.

The driver circuit for outputting signals to the signal lines has the structure described in this embodiment. That is, the driver circuit generates a signal to be input to the j-th signal line with the use of a signal to be input to the (j−1)th signal line. In this manner, a driver circuit with a simple structure can generate a signal with which all the transistors 162 connected between the memory cells 190 in the j-th row and the bit line BL (the transistors 162 in the memory cells in the first to (j−1)th rows) are turned on when the transistors 162 in the memory cells 190 that are distant from the bit line BL (the memory cells 190 in the j-th row) are turned on.

Thus, the number of elements in the driver circuit can be decreased, and the power of the semiconductor device can be reduced.

In the semiconductor device described in this embodiment, the AND circuit is provided instead of the delay circuit 710 in FIG. 9 and the signal from the signal line SYNC is input to the AND circuit, so that the difference between the timings of turning on the transistors 162 in the memory cells 190 in the first to m-th rows can be eliminated. Thus, the transistors 162 in the memory cells 190 in the first to m-th rows can be turned on at the same time.

As described above, the structures, methods, and the like described in this embodiment can be combined with any of the structures, methods, and the like described in the other embodiments as appropriate.

(Embodiment 5)

In this embodiment, a structure and a method for manufacturing a semiconductor device according to one embodiment of the disclosed invention are described with reference to FIGS. 15A and 15B, FIGS. 16A to 16G, FIGS. 17A to 17E, FIGS. 18A to 18D, FIGS. 19A to 19D, and FIGS. 20A to 20C.

<Cross-Sectional Structure and Planar Structure of Semiconductor Device>

Figure 15A:
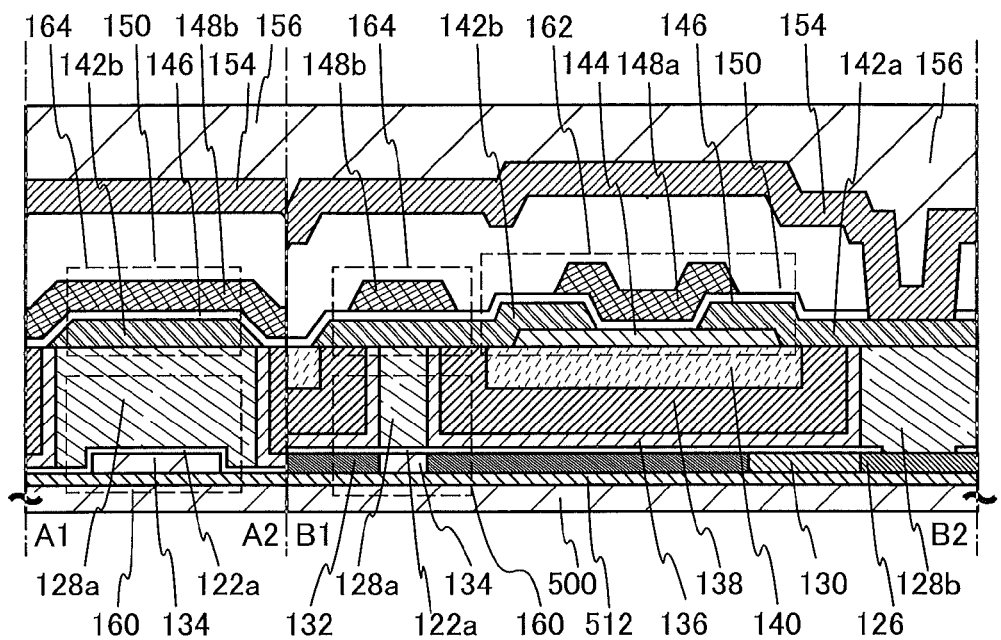
FIGS. 15A and 15B are a cross-sectional view and a plan view of a semiconductor device.
Figure 15B:
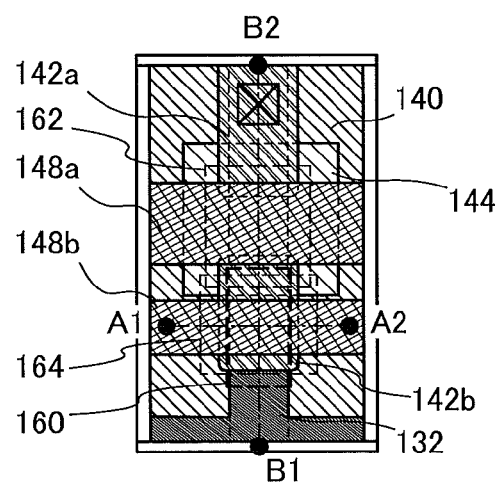

FIGS. 15A and 15B illustrate an example of the structure of a semiconductor device. FIG. 15A is a cross-sectional view of the semiconductor device, and FIG. 15B is a plan view of the semiconductor device. Here, FIG. 15A corresponds to a cross section taken along line A1-A2 and line B1-B2 in FIG. 15B. The semiconductor device illustrated in FIGS. 15A and 15B includes the transistor 160 including a first semiconductor material in a lower portion and the transistor 162 including a second semiconductor material in an upper portion. Here, the first semiconductor material and the second semiconductor material are preferably different from each other. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, indium phosphide, gallium arsenide, or the like and is preferably single crystalline. Alternatively, an organic semiconductor material or the like may be used. A transistor including such a semiconductor material can operate at high speed easily. On the other hand, a transistor including an oxide semiconductor can store electrical charge for a long time because of its characteristics. The semiconductor device illustrated in FIGS. 15A and 15B can be used as a memory cell.

Note that either an n-channel transistor or a p-channel transistor can be used as the transistor 160 and the transistor 162. Here, the case in which the transistor 160 is a p-channel transistor and the transistor 162 is an n-channel transistor is described. The technical feature of the disclosed invention lies in the use of a semiconductor material with which off-state current can be sufficiently reduced, such as an oxide semiconductor, for the transistor 162 in order to retain data. It is therefore not necessary to limit specific conditions, such as materials, structures, and the like of the semiconductor device, to those given here.

The transistor 160 in FIGS. 15A and 15B includes a channel formation region 134 provided in a semiconductor layer over a semiconductor substrate 500, impurity regions 132 (also referred to as a source region and a drain region) with the channel formation region 134 provided therebetween, a gate insulating layer 122a provided over the channel formation region 134, and a gate electrode 128a provided over the gate insulating layer 122a so as to overlap with the channel formation region 134. Note that a transistor whose source electrode and drain electrode are not explicitly illustrated in a drawing might be referred to as a transistor for convenience. Further, in such a case, in description of the connection of a transistor, a source region and a source electrode might be collectively referred to as a "source electrode," and a drain region and a drain electrode might be collectively referred to as a "drain electrode". That is, in this specification, the term "source electrode" might include a source region. In addition, the teen "drain electrode" might include a drain region.

Further, a conductive layer 128b is connected to an impurity region 126 provided in the semiconductor layer over the semiconductor substrate 500. Here, the conductive layer 128b functions as a source electrode or a drain electrode of the transistor 160. In addition, an impurity region 130 is provided between the impurity region 132 and the impurity region 126. Insulating layers 136, 138, and 140 are provided so as to cover the transistor 160. Note that in order to realize high integration, it is preferable that the transistor 160 does not have a sidewall insulating layer as illustrated in FIGS. 15A and 15B. On the other hand, in the case where the characteristics of the transistor 160 have priority, a sidewall insulating layer may be provided on a side surface of the gate electrode 128a, and the impurity region 132 may include a region with a different impurity concentration.

The transistor 162 in FIGS. 15A and 15B includes an oxide semiconductor layer 144 provided over the insulating layer 140 and the like, a source electrode (or a drain electrode) 142a and a drain electrode (or a source electrode) 142b that are electrically connected to the oxide semiconductor layer 144, a gate insulating layer 146 for covering the oxide semiconductor layer 144, the source electrode 142a, and the drain electrode 142b, and a gate electrode 148a provided over the gate insulating layer 146 so as to overlap with the oxide semiconductor layer 144.

Here, the oxide semiconductor layer 144 is preferably a highly-purified oxide semiconductor layer by sufficient removal of impurities such as hydrogen or sufficient supply of oxygen. Specifically, the hydrogen concentration in the oxide semiconductor layer 144 is $5\times10^{19}$ atoms/cm$^3$ or lower, preferably $5\times10^{18}$ atoms/cm$^3$ or lower, more preferably $5\times10^{17}$ atoms/cm$^3$ or lower, for example. Note that the hydrogen concentration in the oxide semiconductor layer 144 is measured by secondary ion mass spectroscopy (SIMS). The oxide semiconductor layer 144 which is highly purified by a sufficient reduction in the hydrogen concentration and is reduced in defect level in an energy gap due to oxygen deficiency by sufficient supply of oxygen has a carrier concentration of lower than $1\times10^{12}$/cm$^3$, preferably lower than $1\times10^{11}$/cm$^3$, more preferably lower than $1.45\times10^{10}$/cm$^3$. For example, the off-state current (here, current per unit channel width (1 μm)) at room temperature (25° C.) is 100 zA (1 zA (zeptoampere) is $1\times10^{-21}$ A) or lower, preferably 10 zA or lower. In this manner, with the use of an oxide semiconductor which is made to be an intrinsic (i-type) or substantially intrinsic oxide semiconductor, the transistor 162 which has extremely excellent off-state current characteristics can be obtained.

Although the oxide semiconductor layer 144 which is processed into an island shape is used in the transistor 162 of FIGS. 15A and 15B in order to reduce leakage current generated between elements due to miniaturization, the oxide semiconductor layer 144 is not necessarily processed into an island shape. In the case where the oxide semiconductor layer 144 is not processed into an island shape, contamination of the oxide semiconductor layer 144 due to etching in the processing can be prevented.

The capacitor 164 in FIGS. 15A and 15B includes the drain electrode 142b, the gate insulating layer 146, and a conductive layer 148b. In other words, the drain electrode 142b functions as one electrode of the capacitor 164, and the conductive layer 148b functions as the other electrode of the capacitor 164. With such a structure, capacitance can be sufficiently secured. Further, insulation between the drain electrode 142b and the conductive layer 148b can be sufficiently secured in the case where the oxide semiconductor layer 144 and the gate insulating layer 146 are stacked. In the case where a capacitor is not needed, it is possible not to provide the capacitor 164.

In this embodiment, the transistor 162 and the capacitor 164 are provided so as to overlap with the transistor 160 at least partly. With such a planar layout, high integration can be realized. For example, the area of the memory cell can be 15 to 25 F$^2$ assuming that the minimum feature size is F.

An insulating layer 150 is provided over the transistor 162 and the capacitor 164. A wiring 154 is provided in an opening formed in the gate insulating layer 146 and the insulating layer 150. The wiring 154 connects one memory cell to another memory cell and corresponds to the bit line BL in the circuit diagram illustrated in FIG. 2. The wiring 154 is connected to the impurity region 126 through the source electrode 142a and the conductive layer 128b. Thus, the number of wirings can be reduced as compared to the case where the source region or the drain region in the transistor 160 and the source electrode 142a in the transistor 162 are connected to different wirings. Accordingly, the integration degree of the semiconductor device can be improved.

With provision of the conductive layer 128b, a position where the impurity region 126 and the source electrode 142a are connected to each other and a position where the source electrode 142a and the wiring 154 are connected to each other can overlap with each other. With such a planar layout, the increase in element area due to contact regions can be prevented. That is, the integration degree of the semiconductor device can be improved.

<Method for Forming SOI Substrate>

Next, an example of a method for forming an SOI substrate used for manufacturing the semiconductor device is described with reference to FIGS. 16A to 16G.

First, the semiconductor substrate 500 is prepared as a base substrate (see FIG. 16A). As the semiconductor substrate 500, a semiconductor substrate such as a single crystal silicon substrate or a single crystal germanium substrate can be used. Alternatively, as the semiconductor substrate, a solar grade silicon (SOG-Si) substrate or the like may be used. Alternatively, a polycrystalline semiconductor substrate may be used. In the case where an SOG-Si substrate, a polycrystalline semiconductor substrate, or the like is used, manufacturing cost can be reduced as compared to the case where a single crystal silicon substrate or the like is used.

Instead of the semiconductor substrate 500, any of the following substrates can be used: a variety of glass substrates used in the electronics industry, such as substrates of aluminosilicate glass, aluminoborosilicate glass, and barium borosilicate glass; a quartz substrate; a ceramic substrate; and a sapphire substrate. Alternatively, a ceramic substrate which contains silicon nitride and aluminum nitride as its main components and whose coefficient of thermal expansion is close to that of silicon may be used.

A surface of the semiconductor substrate 500 is preferably cleaned in advance. Specifically, the semiconductor substrate 500 is preferably subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), or the like.

Next, a bond substrate is prepared. Here, a single crystal semiconductor substrate 510 is used as the bond substrate (see FIG. 16B). Note that although a single crystal substrate is used as the bond substrate here, the crystallinity of the bond substrate is not necessarily limited to single crystal.

As the single crystal semiconductor substrate 510, a single crystal semiconductor substrate formed using an element that belongs to Group 14 of the periodic table, such as a single crystal silicon substrate, a single crystal germanium substrate, or a single crystal silicon germanium substrate, can be used. Alternatively, a compound semiconductor substrate formed using gallium arsenide, indium phosphide, or the like can be used. Typical examples of commercially available silicon substrates include circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to a circular shape, and the single crystal semiconductor substrate 510 may be a substrate which is processed into, for example, a rectangular shape or the like. Further, the single crystal semiconductor substrate 510 can be manufactured by a Czochralski (CZ) method or a floating zone (FZ) method.

An oxide film 512 is formed on a surface of the single crystal semiconductor substrate 510 (see FIG. 16C). In order to remove contamination, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide, and pure water), or the like before the formation of the oxide film 512. Alternatively, diluted hydrofluoric acid and ozone water may be discharged alternately for cleaning.

The oxide film 512 can be formed with a single layer of a silicon oxide film, a silicon oxynitride film, or the like, or a stack of any of these films. As a method for forming the oxide film 512, thermal oxidation, CVD, sputtering, or the like can be used. When the oxide film 512 is formed by CVD, a silicon oxide film is preferably formed using organosilane such as tetraethoxysilane (abbreviation: TEOS, chemical formula: $Si(OC_2H_5)_4$) so that favorable bonding can be achieved.

In this embodiment, the oxide film 512 (here, a $SiO_x$ film) is formed by thermal oxidation treatment of the single crystal semiconductor substrate 510. The thermal oxidation treatment is preferably performed in an oxidizing atmosphere to which halogen is added.

For example, thermal oxidation treatment is performed on the single crystal semiconductor substrate 510 in an oxidizing atmosphere to which chlorine (Cl) is added, so that the oxide film 512 can be formed by chlorine oxidation. In that case, the oxide film 512 is a film containing chlorine atoms. By such chlorine oxidation, heavy metal (e.g., Fe, Cr, Ni, or Mo) that is an extrinsic impurity is trapped and a chloride of the metal is formed and then removed to the outside; thus, contamination of the single crystal semiconductor substrate 510 can be reduced.

Note that halogen atoms contained in the oxide film 512 are not limited to chlorine atoms. Fluorine atoms may be contained in the oxide film 512. As a method for fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Next, ions are accelerated by an electric field, the single crystal semiconductor substrate 510 is irradiated with the ions, and the ions are added to the single crystal semiconductor substrate 510, so that a fragile region 514 where the crystal structure is damaged is formed in the single crystal semiconductor substrate 510 at a predetermined depth (see FIG. 16D).

The depth at which the fragile region 514 is formed can be adjusted by the kinetic energy, mass, electrical charge, or incidence angle of the ions, or the like. The fragile region 514 is formed at approximately the same depth as the average penetration depth of the ions. Thus, the thickness of a single crystal semiconductor layer to be separated from the single crystal semiconductor substrate 510 can be adjusted with the depth at which the ions are added. For example, the average penetration depth may be adjusted so that the thickness of a single crystal semiconductor layer is approximately 10 to 500 nm, preferably, 50 to 200 nm.

The ion irradiation treatment can be performed with an ion doping apparatus or an ion implantation apparatus. As a typical example of the ion doping apparatus, there is a non-mass-separation apparatus in which plasma excitation of a process gas is performed and an object is irradiated with all kinds of ion species generated. In this apparatus, the object is irradiated with ion species of plasma without mass separation. In contrast, an ion implantation apparatus is a mass-separation apparatus. In the ion implantation apparatus, mass separation of ion species of plasma is performed and the object is irradiated with ion species having predetermined masses.

In this embodiment, an example is described in which hydrogen is added to the single crystal semiconductor substrate 510 with the use of an ion doping apparatus. A gas containing hydrogen is used as a source gas. The proportion of $H_3^+$ is preferably set high in the ions used for irradiation. Specifically, it is preferable that the proportion of $H_3^+$ be set 50% or higher (more preferably, 80% or higher) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case where irradiation with hydrogen and irradiation with helium are concurrently performed using an ion doping apparatus, the number of steps can be reduced as compared to the case where irradiation with hydrogen and irradiation with helium are performed in different steps, and the increase in surface roughness of a single crystal semiconductor layer to be formed later can be suppressed.

Note that heavy metal may also be added when the fragile region 514 is formed using the ion doping apparatus; however, when the ion irradiation is performed through the oxide film 512 containing halogen atoms, contamination of the single crystal semiconductor substrate 510 due to the heavy metal can be prevented.

Then, the semiconductor substrate 500 and the single crystal semiconductor substrate 510 are made to face each other and are disposed in close contact with each other through the oxide film 512. Thus, the semiconductor substrate 500 and the single crystal semiconductor substrate 510 are bonded to each other (see FIG. 16E). Note that an oxide film or a nitride film may be deposited on a surface of the semiconductor substrate 500 that is bonded to the single crystal semiconductor substrate 510.

When bonding is performed, it is preferable that a pressure of 0.001 to 100 $N/cm^2$, for example, a pressure of 1 to 20 $N/cm^2$ be applied to one part of the semiconductor substrate 500 or one part of the single crystal semiconductor substrate 510. When the bonding surfaces are made close to each other and disposed in close contact with each other by application of pressure, bonding between the semiconductor substrate 500 and the oxide film 512 is generated at the part where the close contact is made, and from that part, the bonding spontaneously spreads to almost the entire area. This bonding is performed under the action of the Van der Waals force or hydrogen bonding and can be performed at room temperature.

Note that before the single crystal semiconductor substrate 510 and the semiconductor substrate 500 are bonded to each other, surfaces to be bonded are preferably subjected to surface treatment. Surface treatment can improve the bonding strength at an interface between the single crystal semiconductor substrate 510 and the semiconductor substrate 500.

As the surface treatment, wet treatment, dry treatment, or a combination of wet treatment and dry treatment can be used. Alternatively, wet treatment may be used in combination with different wet treatment, or dry treatment may be used in combination with different dry treatment.

Note that heat treatment for increasing the bonding strength may be performed after bonding. This heat treatment is performed at a temperature at which separation at the fragile region 514 does not occur (for example, a temperature of higher than or equal to room temperature and lower than 400° C.). Alternatively, the semiconductor substrate 500 and the oxide film 512 may be bonded to each other while being heated at a temperature in this range. The heat treatment can be performed using a diffusion furnace, a heating furnace such as a resistance heating furnace, a rapid thermal annealing (RTA) apparatus, a microwave heating apparatus, or the like. The temperature condition is only an example, and one embodiment of the disclosed invention should not be construed as being limited to this example.

Next, heat treatment is performed for separation of the single crystal semiconductor substrate 510 at the fragile region, so that a single crystal semiconductor layer 516 is formed over the semiconductor substrate 500 with the oxide film 512 provided therebetween (see FIG. 16F).

Note that the temperature for heat treatment in the separation is preferably as low as possible. This is because the lower the temperature in the separation is, the more surface roughness of the single crystal semiconductor layer 516 can be suppressed. Specifically, for example, the temperature for the heat treatment in the separation may be 300 to 600° C., and the heat treatment is more effective when the temperature is 500° C. or lower (400° C. or higher).

Note that after the single crystal semiconductor substrate 510 is separated, the single crystal semiconductor layer 516 may be subjected to heat treatment at 500° C. or higher so that the concentration of hydrogen remaining in the single crystal semiconductor layer 516 is lowered.

Then, the surface of the single crystal semiconductor layer 516 is irradiated with laser light, whereby a single crystal semiconductor layer 518 in which the flatness of the surface is improved and defects are reduced is formed (see FIG. 16G). Note that instead of the laser light irradiation treatment, heat treatment may be performed.

Note that although the laser light irradiation treatment is performed immediately after the heat treatment for separation of the single crystal semiconductor layer 516 in this embodiment, one embodiment of the present invention should not be construed as being limited to this example. After the heat treatment for separation of the single crystal semiconductor layer 516, etching treatment may be performed so that a surface region having many defects of the single crystal semiconductor layer 516 is removed. Then, the laser light irradiation treatment may be performed. Alternatively, after the surface flatness of the single crystal semiconductor layer 516 is improved, the laser light irradiation treatment may be performed. The etching treatment may be either wet etching or dry etching. Further, in this embodiment, a step of reducing the thickness of the single crystal semiconductor layer 516 may be performed after the laser light irradiation. In order to reduce the thickness of the single crystal semiconductor layer 516, either one or both dry etching and wet etching may be employed.

Through the steps, an SOI substrate including the single crystal semiconductor layer 518 with favorable characteristics can be obtained (see FIG. 16G).

<Method for Manufacturing Semiconductor Device>

Next, a method for manufacturing a semiconductor device formed using the SOI substrate is described with reference to FIGS. 17A to 17E, FIGS. 18A to 18D, FIGS. 19A to 19D, and FIGS. 20A to 20C.

<Method for Forming Transistor in Lower Portion>

First, a method for forming the transistor 160 in the lower portion is described with reference to FIGS. 17A to 17E and FIGS. 18A to 18D. Note that FIGS. 17A to 17E and FIGS. 18A to 18D illustrate part of an SOI substrate formed by the method illustrated in FIGS. 16A to 16G, and are cross-sectional views for illustrating a method for forming a transistor in the lower portion illustrated in FIG. 20A.

Figure 17A:
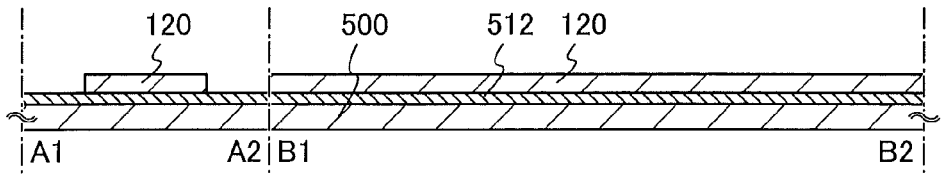
FIGS. 17A to 17E are cross-sectional views for illustrating a method for manufacturing a semiconductor device.

First, the single crystal semiconductor layer 518 is patterned into an island shape so that a semiconductor layer 120 is formed (see FIG. 17A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as an impurity element imparting n-type conductivity. Boron, aluminum, gallium, or the like can be used as an impurity element imparting p-type conductivity.

Figure 17B:
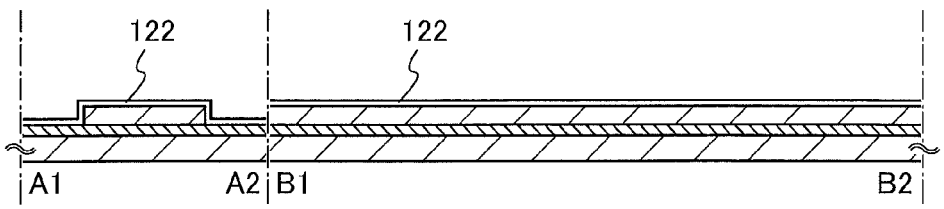

Next, an insulating layer 122 is formed so as to cover the semiconductor layer 120 (see FIG. 17B). The insulating layer 122 is to be a gate insulating layer later. The insulating layer 122 can be formed, for example, by performing heat treatment (e.g., thermal oxidation treatment or thermal nitriding treatment) on a surface of the semiconductor layer 120. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, or hydrogen. Needless to say, the insulating layer may be formed by CVD, sputtering, or the like. The insulating layer 122 preferably has a single-layer structure or a layered structure using a film including any of silicon oxide, silicon oxynitride, silicon nitride oxide, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, and the like formed by CVD, sputtering, or the like. The thickness of the insulating layer 122 can be, for example, 1 to 100 nm, preferably 10 to 50 nm. Here, a single-layer insulating layer containing silicon oxide is formed by plasma-enhanced CVD.

Figure 17C:
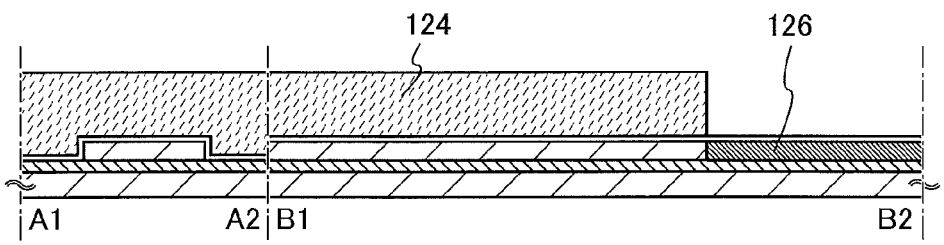

Next, a mask 124 is formed over the insulating layer 122 and an impurity element imparting one conductivity is added to the semiconductor layer 120, so that the impurity region 126 is formed (see FIG. 17C). Note that here, the mask 124 is removed after the impurity element is added.

Figure 17D:
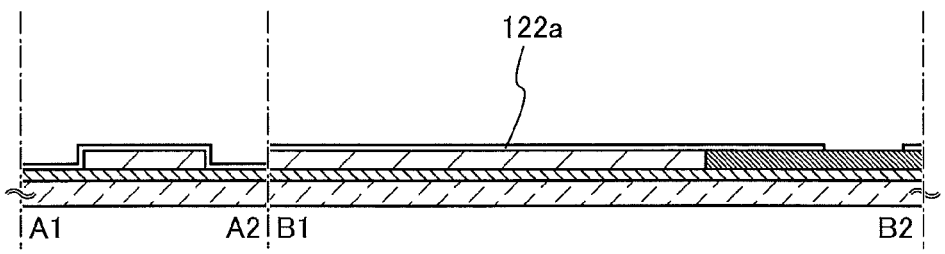

Next, a mask is formed over the insulating layer 122 and a region of the insulating layer 122 that overlaps with the impurity region 126 is partly removed, so that the gate insulating layer 122a is formed (see FIG. 17D). Part of the insulating layer 122 can be removed by etching such as wet etching or dry etching.

Figure 17E:
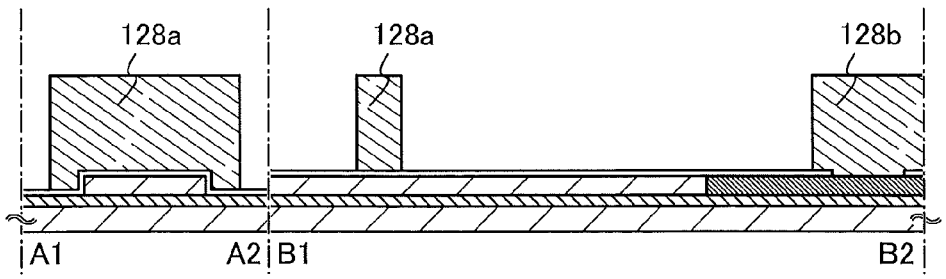

Next, a conductive layer used for forming a gate electrode (including a wiring formed using the same layer as the gate electrode) is formed over the gate insulating layer 122a and is processed, so that the gate electrode 128a and the conductive layer 128b are formed (see FIG. 17E).

The conductive layer used for the gate electrode 128a and the conductive layer 128b can be formed using a metal material such as aluminum, copper, titanium, tantalum, or tungsten. Alternatively, a layer including a conductive material may be formed using a semiconductor material such as polycrystalline silicon. There is no particular limitation on the method for forming the layer containing a conductive material, and a variety of deposition methods such as vapor deposition, CVD, sputtering, or spin coating can be employed. The conductive layer may be processed by etching using a resist mask.

Figure 18A:
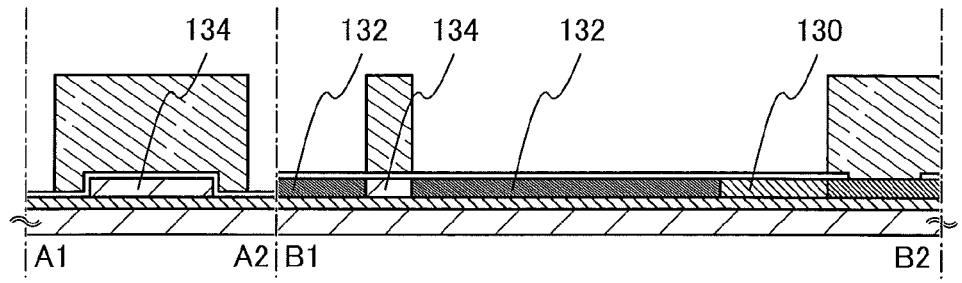
FIGS. 18A to 18D are cross-sectional views for illustrating the method for manufacturing a semiconductor device.

Next, an impurity element imparting one conductivity is added to the semiconductor layer with the use of the gate electrode 128a and the conductive layer 128b as masks, so that the channel formation regions 134, the impurity regions 132, and the impurity region 130 are formed (see FIG. 18A). Although an impurity element such as phosphorus (P) or arsenic (As) is added here because an n-channel transistor is formed, in the case where a p-channel transistor is formed, an impurity element such as boron (B) or aluminum (Al) is added. Here, the concentration of an impurity element to be added can be set as appropriate. In addition, after the impurity element is added, heat treatment for activation is performed. Here, the concentration of the impurity element in the impurity region is increased in the following order: the impurity region 126, the impurity region 132, and the impurity region 130.

Figure 18B:
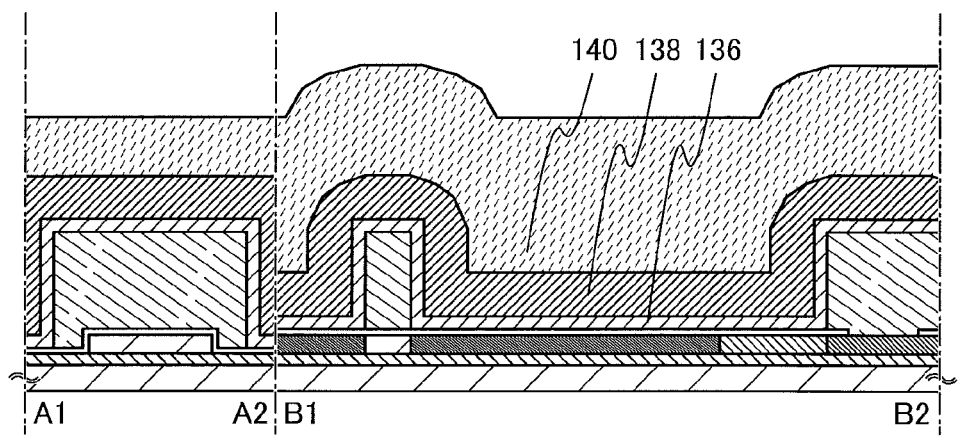

Next, the insulating layers 136, 138, and 140 are formed so as to cover the gate insulating layer 122a, the gate electrode 128a, and the conductive layer 128b (see FIG. 18B).

The insulating layers 136, 138, and 140 can be formed using an inorganic insulating material such as silicon oxide, silicon oxynitride, silicon nitride oxide, silicon nitride, or aluminum oxide. In particular, the insulating layers 136, 138, and 140 are preferably formed using a low dielectric constant (low-k) material because capacitance due to overlapping of electrodes or wirings can be sufficiently reduced. Note that a porous insulating layer formed using such a material may be used as the insulating layers 136, 138, and 140. Since the porous insulating layer has lower dielectric constant than a dense insulating layer, capacitance due to electrodes or wirings can be further reduced. Alternatively, the insulating layers 136, 138, and 140 can be formed using an organic insulating material such as polyimide or acrylic. In this embodiment, the case where silicon oxynitride is used for the insulating layer 136, silicon nitride oxide is used for the insulating layer 138, and silicon oxide is used for the insulating layer 140 is described. Note that although a layered structure of the insulating layer 136, the insulating layer 138, and the insulating layer 140 is used here, one embodiment of the disclosed invention is not limited to this structure. A single-layer structure, a layered structure of two layers, or a layered structure of four or more layers may be used.

Figure 18C:
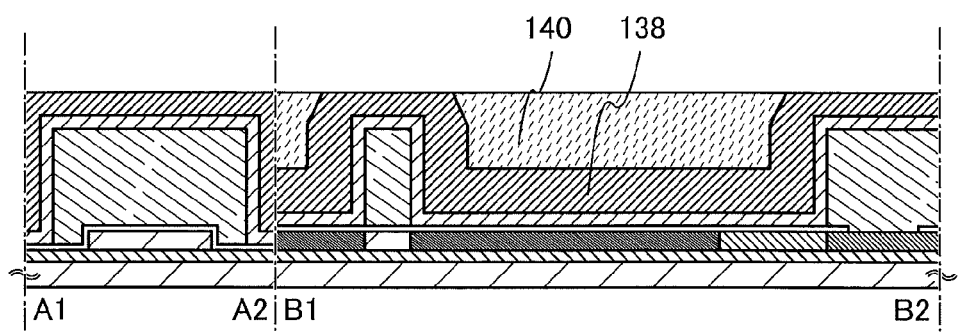

Next, the insulating layers 138 and 140 are subjected to CMP (chemical mechanical polishing) or etching, so that the insulating layers 138 and 140 are flattened (see FIG. 18C). Here, CMP is performed until the insulating layer 138 is partly exposed. In the case where silicon nitride oxide is used for the insulating layer 138 and silicon oxide is used for the insulating layer 140, the insulating layer 138 functions as an etching stopper.

Figure 18D:
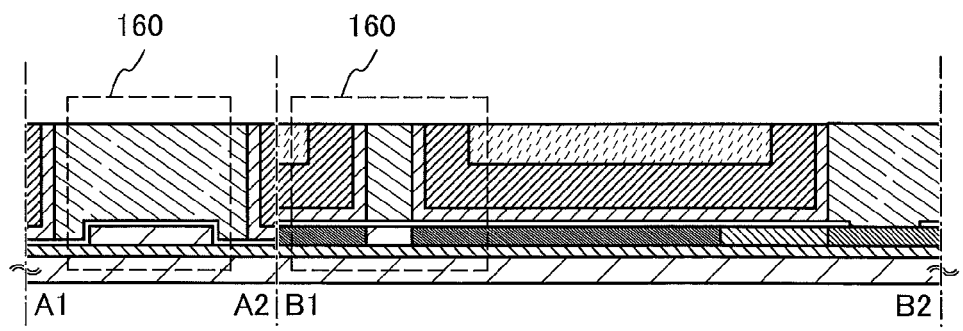

Next, the insulating layers 138 and 140 are subjected to CMP or etching, so that upper surfaces of the gate electrode 128a and the conductive layer 128b are exposed (see FIG. 18D). Here, etching is performed until the gate electrode 128a and the conductive layer 128b are partly exposed. For the etching, dry etching is preferably performed, but wet etching may be performed. In a step of partly exposing the gate electrode 128a and the conductive layer 128b, in order to improve the characteristics of the transistor 162 which is formed later, surfaces of the insulating layers 138 and 140 are preferably flattened as much as possible.

Through the steps, the transistor 160 in the lower portion can be formed (see FIG. 18D).

Note that before or after the steps, a step of forming an electrode, a wiring, a semiconductor layer, an insulating layer, or the like may be further performed. For example, a multilayer wiring structure in which an insulating layer and a conductive layer are stacked is employed as a wiring structure, so that a highly-integrated semiconductor device can be realized.

<Method for Forming Transistor in Upper Portion>

Next, a method for forming the transistor 162 in the upper portion is described with reference to FIGS. 19A to 19D and FIGS. 20A to 20C.

Figure 19A:
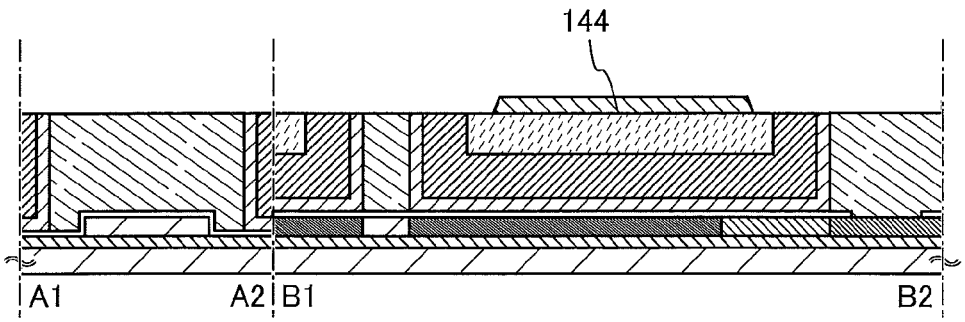
FIGS. 19A to 19D are cross-sectional views for illustrating the method for manufacturing a semiconductor device.

First, an oxide semiconductor layer is formed over the gate electrode 128a, the conductive layer 128b, the insulating layers 136, 138, and 140, and the like and is processed, so that the oxide semiconductor layer 144 is formed (see FIG. 19A). Note that an insulating layer functioning as a base may be formed over the insulating layers 136, 138, and 140 before the oxide semiconductor layer is formed. The insulating layer can be formed by PVD such as sputtering, CVD such as plasma-enhanced CVD, or the like.

As a material used for the oxide semiconductor layer, a four-component metal oxide such as In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; a single-component metal oxide such as an In—O-based material, a Sn—O-based material, or a Zn—O-based material; or the like can be used. In addition, the materials may contain $SiO_2$. Here, for example, an In—Ga—Zn—O-based material means an oxide film containing indium (In), gallium (Ga), and zinc (Zn), and there is no particular limitation on the stoichiometric proportion. Further, the In—Ga—Zn—O-based oxide semiconductor may contain an element other than In, Ga, and Zn.

The oxide semiconductor layer can be a thin film formed using a material expressed by a chemical formula of $InMO_3(ZnO)_m$ (m>0). Here, M represents one or more metal elements selected from Ga, Al, Mn, or Co. For example, M can be Ga, Ga and Al, Ga and Mn, Ga and Co, or the like.

The thickness of the oxide semiconductor layer is preferably 3 to 30 nm. This is because the transistor might be normally on when the oxide semiconductor layer is too thick (e.g., the thickness is 50 nm or more).

The oxide semiconductor layer is preferably formed by a method in which an impurity such as hydrogen, water, a hydroxyl group, or hydride does not enter the oxide semiconductor layer easily. For example, the oxide semiconductor layer can be formed by sputtering or the like.

In the case where an In—Zn—O-based material is used for the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 in a molar ratio). For example, when a target used for deposition of an In—Zn—O-based oxide semiconductor has a composition ratio of In:Zn:O=X:Y:Z in an atomic ratio, where Z>1.5X+Y.

In this embodiment, the oxide semiconductor layer is formed by sputtering using an In—Ga—Zn—O-based oxide target.

As the In—Ga—Zn—O-based oxide target, for example, an oxide target with a composition ratio of $In_2O_3$:$Ga_2O_3$:ZnO=1:1:1 (in a molar ratio) can be used. Note that it is not necessary to limit the material and composition ratio of the target to the above. For example, an oxide target with a composition ratio of $In_2O_3$:$Ga_2O_3$:ZnO=1:1:2 (in a molar ratio) can be used.

The filling rate of the oxide target is 90 to 100%, preferably 95 to 99.9%. With the use of a metal oxide semiconductor deposition target with a high filling rate, a dense oxide semiconductor layer can be deposited.

The atmosphere for deposition may be a rare gas (typically argon) atmosphere, an oxygen atmosphere, or a mixed atmosphere containing a rare gas and oxygen. It is preferable to employ an atmosphere using a high-purity gas from which an impurity such as hydrogen, water, a hydroxyl group, or hydride is removed so that hydrogen, water, a hydroxyl group, hydride, or the like can be prevented from entering the oxide semiconductor layer.

For example, the oxide semiconductor layer can be formed as follows.

First, the substrate is held in a deposition chamber kept under reduced pressure, and is heated so that the substrate temperature is higher than 200° C. and lower than or equal to 500° C., preferably higher than 300° C. and lower than or equal to 500° C., more preferably higher than or equal to 350° C. and lower than or equal to 450° C.

Then, a high-purity gas from which an impurity such as hydrogen, water, a hydroxyl group, or hydride is sufficiently removed is introduced while moisture remaining in the deposition chamber is removed, and the oxide semiconductor layer is formed over the substrate with the use of the target. In order to remove moisture remaining in the deposition chamber, an adsorption vacuum pump such as a cryopump, an ion pump, or a titanium sublimation pump is preferably used. A turbo pump to which a cold trap is added may be used as an exhaustion means. In the deposition chamber which is exhausted with the cryopump, for example, an impurity such as hydrogen, water, a hydroxyl group, or hydride (preferably a compound containing a carbon atom) and the like are removed. Thus, the concentration of an impurity such as hydrogen, water, a hydroxyl group, or hydride contained in the oxide semiconductor layer deposited in the deposition chamber can be lowered.

In the case where the substrate temperature is low (for example, 100° C. or lower) during deposition, a substance including a hydrogen atom might enter the oxide semiconductor; thus, it is preferable that the substrate be heated at a temperature in the above range. When the oxide semiconductor layer is deposited with the substrate heated at the temperature, the substrate temperature is increased, so that hydrogen bonds are cut by heat and are less likely to be taken into the oxide semiconductor layer. Thus, the oxide semiconductor layer is deposited with the substrate heated at the temperature, so that the concentration of an impurity such as hydrogen, water, a hydroxyl group, or hydride contained in the oxide semiconductor layer can be sufficiently reduced. In addition, damage due to sputtering can be reduced.

An example of the deposition condition is as follows: the distance between the substrate and the target is 60 mm, the pressure is 0.4 Pa, the DC power is 0.5 kW, the substrate temperature is 400° C., and the deposition atmosphere is an oxygen atmosphere (the proportion of the oxygen flow rate is 100%). Note that a pulsed DC power source is preferable because powdery substances (also referred to as particles or dust) generated in the deposition can be reduced and the film thickness can be uniform.

Note that before the oxide semiconductor layer is deposited by sputtering, powdery substances (also referred to as particles or dust) which attach to a surface over which the oxide semiconductor layer is formed are preferably removed by reverse sputtering in which an argon gas is introduced and plasma is generated. The reverse sputtering is a method in which voltage is applied to a substrate and plasma is generated in the vicinity of the substrate so that a surface of the substrate side is modified. Note that instead of argon, a gas such as nitrogen, helium, or oxygen may be used.

The oxide semiconductor layer can be processed by etching after a mask with a desired shape is formed over the oxide semiconductor layer. The mask can be formed by a method such as photolithography. Alternatively, the mask may be formed by a method such as an inkjet method. Note that the etching of the oxide semiconductor layer may be either dry etching or wet etching. Needless to say, dry etching and wet etching may be employed in combination.

After that, heat treatment (first heat treatment) may be performed on the oxide semiconductor layer 144. By the heat treatment, substances including hydrogen atoms in the oxide semiconductor layer 144 can be further removed. The heat treatment is performed at 250 to 700° C., preferably 450 to 600° C. or lower than the strain point of the substrate in an inert gas atmosphere. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon, which is introduced into a heat treatment apparatus, is 6 N (99.9999%) or more, preferably 7 N (99.99999%) (that is, the impurity concentration is 1 ppm or lower, preferably 0.1 ppm or lower).

The heat treatment can be performed in such a manner that, for example, an object is introduced into an electric furnace in which a resistance heater or the like is used at 450° C. for 1 h in a nitrogen atmosphere. The oxide semiconductor layer 144 is not exposed to the air during the heat treatment so that entry of water or hydrogen can be prevented.

The heat treatment can be referred to as dehydration treatment, dehydrogenation treatment, or the like because of its advantageous effect of removing hydrogen, water, or the like. The heat treatment can be performed, for example, before the oxide semiconductor layer is processed into an island shape, after the gate insulating film is formed, or the like. Such dehydration treatment or dehydrogenation treatment may be conducted more than once.

Figure 19B:
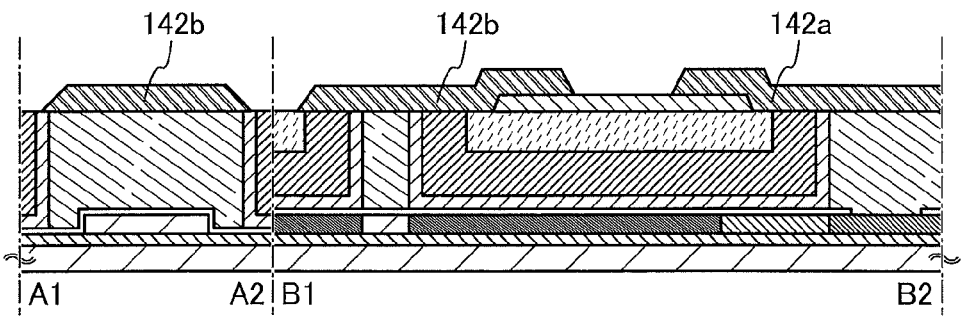

Next, a conductive layer to be a source electrode and a drain electrode (including a wiring formed using the same layer as the source electrode and the drain electrode) is formed over the oxide semiconductor layer 144 and the like and is processed, so that the source electrode 142a and the drain electrode 142b are formed (see FIG. 19B).

The conductive layer can be formed by PVD or CVD. As the material of the conductive layer, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

The conductive layer can have a single-layer structure or a layered structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked. Note that in the case where the conductive layer has a single-layer structure of a titanium film or a titanium nitride film, there is an advantage that the conductive layer is easily processed into the source electrode 142a and the drain electrode 142b having tapered shapes.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer is preferably etched so that end portions of the source electrode 142a and the drain electrode 142b are tapered. Here, it is preferable that a taper angle be 30 to 60°, for example. Etching is performed so that the end portions of the source electrode 142a and the drain electrode 142b are tapered. Thus, coverage with the gate insulating layer 146 formed later can be improved and disconnection can be prevented.

The channel length (L) of the transistor in the upper portion is determined by a distance between a lower end portion of the source electrode 142a and a lower end portion of the drain electrode 142b. Note that for exposure for forming a mask used at the time when a transistor with a channel length (L) of less than 25 nm is formed, it is preferable to use extreme ultraviolet rays whose wavelength is as short as several nanometers to several tens of nanometers. In the exposure by extreme ultraviolet rays, the resolution is high and the focus depth is large. Accordingly, the channel length (L) of the transistor to be formed later can be 10 nm to 1000 nm (1 μm), and the circuit can operate at higher speed. Further, the power consumption of the semiconductor device can be reduced by miniaturization.

As an example that is different from the example in FIG. 19B, an oxide conductive layer functioning as a source region and a drain region can be provided between the oxide semiconductor layer 144 and the source and drain electrodes.

For example, an oxide conductive film is formed over the oxide semiconductor layer 144; a conductive layer is formed over the oxide conductive film; and the oxide conductive film and the conductive layer are processed through the same photolithography process. Thus, an oxide conductive layer functioning as a source region and a drain region, the source electrode 142a, and the drain electrode 142b can be formed.

Alternatively, a stack of an oxide semiconductor film and an oxide conductive film is formed and is processed through the same photolithography process, so that the island-shaped oxide semiconductor layer 144 and an island-shaped oxide conductive film are formed. After the source electrode 142a and the drain electrode 142b are formed, the island-shaped oxide conductive film may be etched using the source electrode 142a and the drain electrode 142b as masks so that an oxide conductive layer functioning as a source region and a drain region can be formed.

Note that at the time of etching for processing the oxide conductive layer, etching conditions (e.g., the kind of an etchant, the concentration, and the etching time) are adjusted as appropriate so that the oxide semiconductor layer is not excessively etched.

The material of the oxide conductive layer preferably contains zinc oxide as a component and preferably does not contain indium oxide. For such an oxide conductive layer, zinc oxide, zinc aluminum oxide, zinc aluminum oxynitride, gallium zinc oxide, or the like can be used.

When the oxide conductive layer is provided between the oxide semiconductor layer and the source and drain electrodes, the resistance of the source region and the drain region can be lowered, and the transistor can operate at high speed.

With the structure of the oxide semiconductor layer 144, the oxide conductive layer, and the drain electrode formed using a metal material, the withstand voltage of the transistor can be further increased.

It is effective to use the oxide conductive layer for the source region and the drain region in order to improve the frequency characteristics of a peripheral circuit (a driver circuit). This is because contact resistance can be further lowered in the case where a metal electrode (formed using molybdenum, tungsten, or the like) is in contact with the oxide conductive layer as compared to the case where a metal electrode (formed using molybdenum, tungsten, or the like) is in contact with the oxide conductive layer. The contact resistance can be lowered by provision of the oxide conductive layer between the oxide semiconductor layer and the source and drain electrodes, so that the frequency characteristics of a peripheral circuit (a driver circuit) can be improved.

Figure 19C:
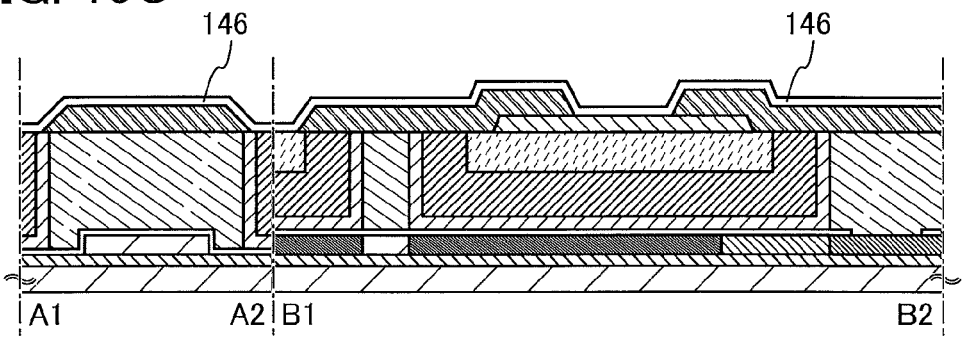

Next, the gate insulating layer 146 is formed so as to cover the source electrode 142 and the drain electrode 142*b* and to be in contact with part of the oxide semiconductor layer 144 (see FIG. 19C).

The gate insulating layer 146 can be formed by CVD, sputtering, or the like. The gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate (Hf-$Si_xO_y$ (x>0, y>0)), hafnium silicate to which nitrogen is added ($HfSi_xO_yN_z$ (x>0, y>0, z>0)), hafnium aluminate to which nitrogen is added ($HfSi_xO_yN_z$(x>0, y>0, z>0)), or the like. The gate insulating layer 146 may have a single-layer structure or a layered structure in which these elements are combined. There is no particular limitation on the thickness; however, in the case where a semiconductor device is miniaturized, the thickness is preferably small in order to secure the operation of the transistor. For example, in the case where silicon oxide is used, the thickness can be 1 to 100 nm, preferably 10 to 50 nm.

When the gate insulating layer is thin as described above, gate leakage due to a tunneling effect or the like becomes problematic. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ (x>0, y>0)), hafnium silicate to which nitrogen is added ($HfSi_xO_yN_z$ (x>0, y>0, z>0)), or hafnium aluminate to which nitrogen is added ($HfAl_xO_yN_z$ (x>0, y>0, z>0)). By using a high-k material for the gate insulating layer 146, electrical characteristics can be secured and the thickness can be increased in order prevent gate leakage. Note that a layered structure of a film containing a high-k material and a film containing any of silicon oxide, silicon nitride, silicon oxynitride, silicon nitride oxide, aluminum oxide, or the like may be employed.

Further, an insulating layer which is in contact with the oxide semiconductor layer 144 (in this embodiment, the gate insulating layer 146) may be formed using an insulating material containing an element that belongs to Group 13 and oxygen. Many oxide semiconductor materials contain elements that belong to Group 13, and an insulating material containing an element that belongs to Group 13 is compatible with an oxide semiconductor. Thus, when an insulating material containing an element that belongs to Group 13 is used for the insulating layer which is in contact with the oxide semiconductor layer, an interface with the oxide semiconductor layer can be kept well.

An insulating material containing an element that belongs to Group 13 is an insulating material containing one or more elements that belong to Group 13. Examples of the insulating material containing an element that belongs to Group 13 include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

For example, in the case where a gate insulating layer is formed in contact with an oxide semiconductor layer containing gallium, when a material containing gallium oxide is used for the gate insulating layer, favorable characteristics can be kept at the interface between the oxide semiconductor layer and the gate insulating layer. When the oxide semiconductor layer and the insulating layer containing gallium oxide are provided in contact with each other, pileup of hydrogen at the interface between the oxide semiconductor layer and the insulating layer can be reduced. Note that a similar effect can be obtained in the case where an element that belongs to the same group as a constituent element of the oxide semiconductor is used for the insulating layer. For example, it is effective to form an insulating layer with the use of a material containing aluminum oxide. Aluminum oxide does not easily transmit water. Thus, it is preferable to use the material including aluminum oxide in order to prevent water from entering the oxide semiconductor layer.

The insulating layer which is in contact with the oxide semiconductor layer 144 preferably contains oxygen in a proportion higher than that in the stoichiometric composition, by heat treatment in an oxygen atmosphere or oxygen doping. Oxygen doping is addition of oxygen to a bulk. Note that the term "bulk" is used in order to clarify that oxygen is added not only to a surface of a thin film but also to the inside of the thin film. In addition, the term "oxygen doping" includes "oxygen plasma doping" in which oxygen which is made to be plasma is added to a bulk. The oxygen doping may be performed by ion implantation or ion doping.

For example, in the case where the insulating layer which is in contact with the oxide semiconductor layer 144 is formed using gallium oxide, the composition of gallium oxide can be set to be $Ga_2O_x$ (x=3+α, 0<α<1) by heat treatment in an oxygen atmosphere or oxygen doping. In the case where the insulating layer which is in contact with the oxide semiconductor layer 144 is formed using aluminum oxide, the composition of aluminum oxide can be set to be $Al_2O_x$ (x=3+α, 0<α<1) by heat treatment in an oxygen atmosphere or oxygen doping. In the case where the insulating layer which is in contact with the oxide semiconductor layer 144 is formed using gallium aluminum oxide (aluminum gallium oxide), the composition of gallium aluminum oxide (aluminum gallium oxide) can be set to be $Ga_xAl_{2-x}O_{3+α}$ (0<x<2, 0<α<1) by heat treatment in an oxygen atmosphere or oxygen doping.

By oxygen doping or the like, an insulating layer including a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, and oxygen deficiency in the oxide semiconductor layer subjected to dehydration or dehydrogenation or at the interface between the oxide semiconductor layer and the insulating layer is reduced. Thus, the oxide semiconductor layer can be formed to an intrinsic (i-type) or substantially intrinsic oxide semiconductor.

Note that the insulating layer which includes a region where the proportion of oxygen is higher than that in the stoichiometric composition may be applied to the insulating layer serving as a base film of the oxide semiconductor layer 144 instead of the gate insulating layer 146, or both the gate insulating layer 146 and the base insulating layer.

After the gate insulating layer 146 is formed, second heat treatment is preferably performed in an inert gas atmosphere or an oxygen atmosphere. The temperature of the heat treatment is 200 to 450° C., preferably 250 to 350° C. For example, the heat treatment may be performed at 250° C. for 1 h in a nitrogen atmosphere. The second heat treatment can reduce variations in electrical characteristics of the transistor. Further, in the case where the gate insulating layer 146 includes oxygen, oxygen can be supplied to the oxide semiconductor layer 144 subjected to dehydration or dehydrogenation and oxygen vacancies in the oxide semiconductor layer 144 can be filled; thus, an intrinsic (i-type) or substantially intrinsic oxide semiconductor layer can be formed.

Note that in this embodiment, the second heat treatment is performed after the gate insulating layer 146 is formed; however, the timing of the second heat treatment is not limited to this. For example, the second heat treatment may be performed after the gate electrode is formed. Alternatively, the first heat treatment and the second heat treatment may be performed successively, the first heat treatment may serve as the second heat treatment, or the second heat treatment may serve as the first heat treatment.

Figure 19D:
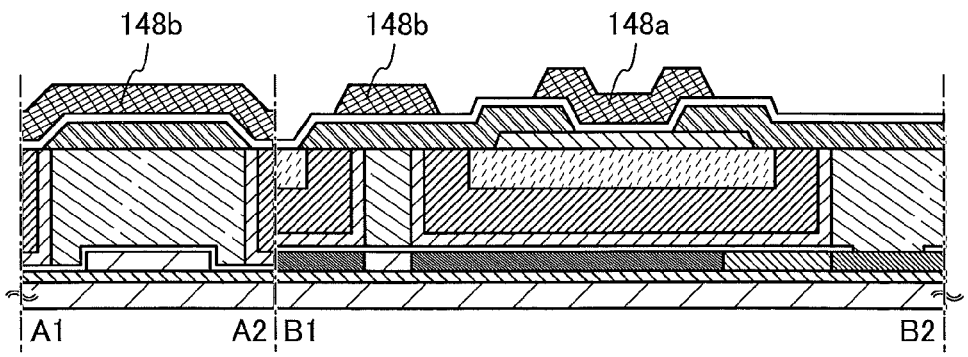

Next, a conductive layer used for forming a gate electrode (including a wiring formed using the same layer as the gate electrode) is formed and processed, so that the gate electrode 148a and the conductive layer 148b are formed (see FIG. 19D).

The gate electrode 148a and the conductive layer 148b can be formed using a metal material such as molybdenum, titanium, tantalum, tungsten, aluminum, copper, neodymium, or scandium, or an alloy material containing any of these materials as its main component. Note that the gate electrode 148a and the conductive layer 148b may have a single-layer structure or a layered structure.

Figure 20A:
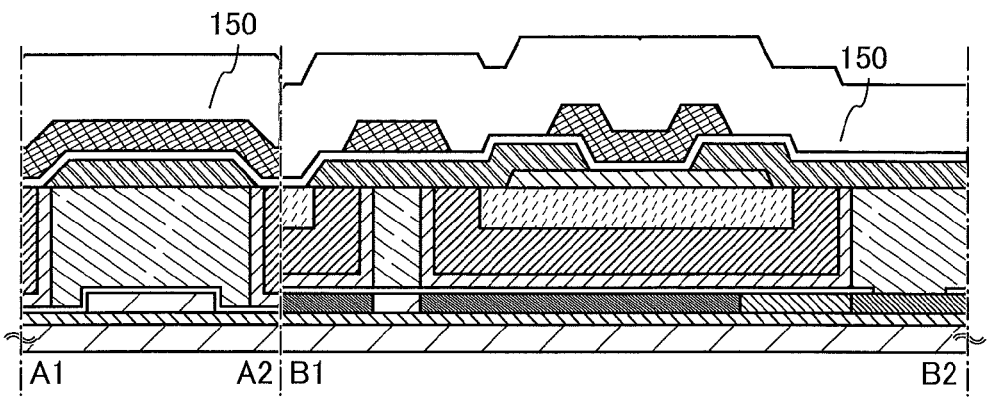
FIGS. 20A to 20C are cross-sectional views for illustrating the method for manufacturing a semiconductor device.
Figure 20B:
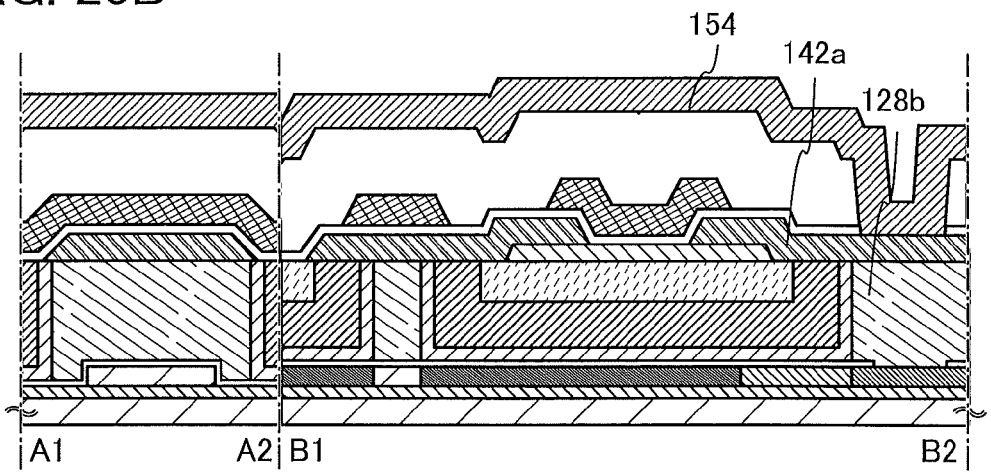

Next, the insulating layer 150 is formed over the gate insulating layer 146, the gate electrode 148a, and the conductive layer 148b (see FIG. 20A). The insulating layer 150 can be formed by PVD, CVD, or the like. The insulating layer 150 can be formed using a material including an inorganic insulating material such as silicon oxide, silicon oxynitride, silicon nitride, hafnium oxide, gallium oxide, or aluminum oxide. Note that for the insulating layer 150, a material with a low dielectric constant may be preferably used or a structure with a low dielectric constant (e.g., a porous structure) may be preferably employed. This is because when the insulating layer 150 has a low dielectric constant, capacitance generated between wirings, electrodes, or the like can be reduced and operation speed can be increased. Note that although the insulating layer 150 has a single-layer structure in this embodiment, one embodiment of the disclosed invention is not limited to this structure. The insulating layer 150 may have a layered structure of two or more layers.

Next, an opening reaching the drain electrode 142b is formed in the gate insulating layer 146 and the insulating layer 150. Then, the wiring 154 connected to the drain electrode 142b is formed over the insulating layer 150 (see FIG. 20B). Note that the opening is formed by selective etching using a mask or the like.

A conductive layer is formed by PVD or CVD and then is patterned, so that the wiring 154 is formed. As the material of the conductive layer, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening of the insulating layer 150 by PVD and a thin titanium film (with a thickness of about 5 nm) is formed by PVD, and then, an aluminum film is formed so as to be embedded in the opening. Here, the titanium film formed by PVD has a function of reducing an oxide film (e.g., a native oxide film) formed on a surface over which the titanium film is formed, to decrease the contact resistance with the lower electrode or the like (here, the drain electrode 142b). In addition, hillocks of the aluminum film can be prevented. A copper film may be formed by a plating method after a barrier film of titanium, titanium nitride, or the like is formed.

The opening formed in the insulating layer 150 is preferably formed in a region overlapping with the conductive layer 128b. With provision of the opening in such a region, the increase in element area due to a contact region can be prevented.

Here, the case where a position where the impurity region 126 and the drain electrode 142b are connected to each other and a position where the drain electrode 142b and the wiring 154 are connected to each other overlap with each other without the use of the conductive layer 128b is described. In that case, an opening (also referred to as a contact in a lower portion) is formed in the insulating layers 136, 138, and 140 that are formed over the impurity region 126, and the drain electrode 142b is formed in the contact in the lower portion. After that, an opening (also referred to as a contact in an upper portion) is formed in a region overlapping with the contact in the lower portion in the gate insulating layer 146 and the insulating layer 150, and then the wiring 154 is formed. When the contact in the upper portion is formed in the region overlapping with the contact in the lower portion, the drain electrode 142b formed in the contact in the lower portion might be disconnected by etching. In order to avoid the disconnection, the contacts in the lower portion and in the upper portion are formed so as not to overlap with each other, so that a problem of the increase in element area occurs.

As described in this embodiment, with the use of the conductive layer 128b, the contact in the upper portion can be formed without disconnection of the drain electrode 142b. Thus, the contact in the lower portion and in the upper portion can be formed so as to overlap with each other, so that the increase in element area due to contact regions can be prevented. That is, the integration degree of the semiconductor device can be improved.

Figure 20C:
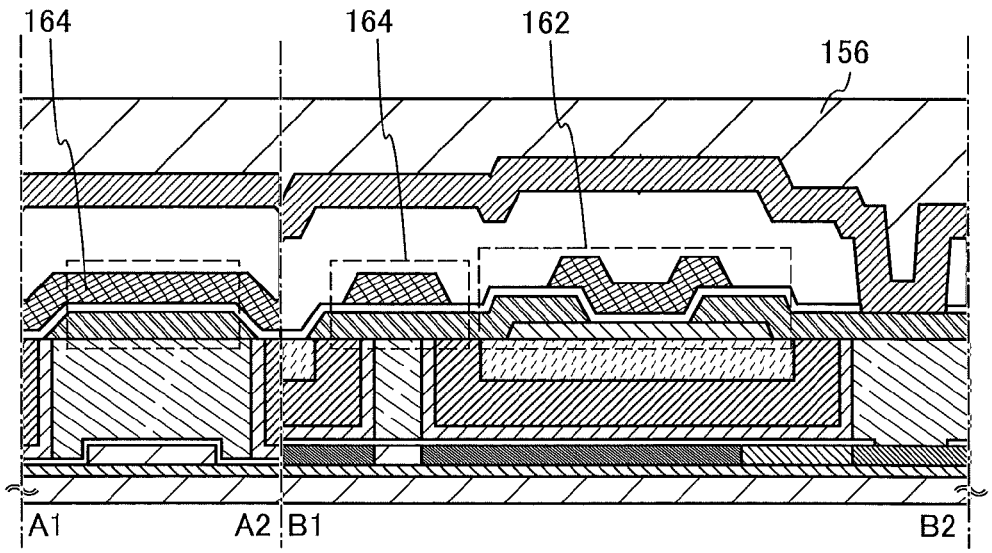

Next, an insulating layer 156 is formed so as to cover the wiring 154 (see FIG. 20C).

Through the steps, the transistor 162 including the highly-purified oxide semiconductor layer 144 and the capacitor 164 are completed (see FIG. 20C).

As described above, the structures, methods, and the like described in this embodiment can be combined with any of the structures, methods, and the like described in the other embodiments as appropriate.

This application is based on Japanese Patent Application serial No. 2010-176959 filed with Japan Patent Office on Aug. 6, 2010, the entire contents of which are hereby incorporated by reference.

What is claimed is:

1. A semiconductor device comprising:
   a bit line;
   m (m is a natural number of 3 or more) word lines;
   a source line;
   m signal lines;
   first to m-th memory cells; and
   a driver circuit,
   wherein each of the first to m-th memory cells comprises:
   a first transistor including a first gate terminal, a first source terminal, and a first drain terminal:

a second transistor including a second gate terminal, a second source terminal, and a second drain terminal; and a capacitor, wherein a channel of the second transistor includes an oxide semiconductor layer, wherein the source line is electrically connected to the first source terminal in the m-th memory cell, wherein a k-th (k is a natural number of 1 to m) signal line is electrically connected to the second gate terminal in the k-th memory cell, wherein a k-th word line is electrically connected to a first terminal of the capacitor in the k-th memory cell, wherein the second drain terminal in the j-th (j is a natural number of 3 to m) memory cell is electrically connected to the first gate terminal in the (j−1)th memory cell, the second source terminal in the (j−1)th memory cell, and a second terminal of the capacitor in the (j−1)th memory cell, wherein the first gate terminal in the m-th memory cell, the second source terminal in the m-th memory cell, and a second terminal of the capacitor in the m-th memory cell are electrically connected to each other, wherein the first drain terminal in the j-th memory cell is electrically connected to the first source terminal in the (j−1)th memory cell, wherein the driver circuit includes m first circuits and (m−1) second circuits, wherein a write control signal and m row address selection signals are input to the driver circuit, wherein the write control signal and a j-th row address selection signal are input to a j-th first circuit, wherein an output from a (j−2)th first circuit and an output from a (j−1)th second circuit are input to a (j−2)th second circuit, wherein the output from the (j−1)th second circuit is input to a (j−1)th signal line, and wherein an output from an m-th first circuit is input to an m-th signal line.

2. The semiconductor device according to claim 1, wherein the driver circuit includes one delay circuit, and wherein the output from the m-th first circuit is input to the m-th signal line though the delay circuit.

3. The semiconductor device according to claim 1, wherein the driver circuit includes m delay circuits, wherein the output from the (j−1)th second circuit is input to the (j−1)th signal line through a (j−1)th delay circuit, and wherein the output from the m-th first circuit is input to the m-th signal line though an m-th delay circuit.

4. The semiconductor device according to claim 1, wherein the first transistor includes:

a channel formation region provided over a substrate including a semiconductor material;

impurity regions provided so as to sandwich the channel formation region;

a first gate insulating layer over the channel formation region; and a first gate electrode provided over the first gate insulating layer so as to overlap with the channel formation region.

5. The semiconductor device according to claim 4, wherein the substrate including a semiconductor material is one of a single crystal semiconductor substrate and an SOI substrate.

6. The semiconductor device according to claim 4, wherein the semiconductor material is silicon.

7. The semiconductor device according to claim 1, wherein the second transistor includes a second gate electrode provided so as to overlap with the oxide semiconductor layer and a second gate insulating layer provided between the oxide semiconductor layer and the second gate electrode.

8. The semiconductor device according to claim 1, wherein the oxide semiconductor layer includes an oxide semiconductor material containing In, Ga, and Zn.

9. The semiconductor device according to claim 1, wherein the (m−1) second circuits output "1" when at least one of the signals input is "1".

10. The semiconductor device according to claim 1, wherein the first circuit is an AND circuit.

11. The semiconductor device according to claim 1, wherein the second circuit is an OR circuit.

* * * * *

UNITED STATES PATENT AND TRADEMARK OFFICE
CERTIFICATE OF CORRECTION

PATENT NO. : 8,467,232 B2  
APPLICATION NO. : 13/193966  
DATED : June 18, 2013  
INVENTOR(S) : Takanori Matsuzaki et al.

Page 1 of 1

It is certified that error appears in the above-identified patent and that said Letters Patent is hereby corrected as shown below:

In the Specification

Column 2, line 23, before "signal" replace "in" with --*m*--;

Column 10, line 49, after "and" replace "in" with --*m*--;

Column 17, line 56, after "data" insert --,--;

Column 18, line 26, after "and" replace "in" with --*m*--;

Column 33, line 40, replace "teen" with --term--;

Column 45, line 20, replace "$HfSi_xO_yN_z$" with --$HfAl_xO_yN_z$--.

Signed and Sealed this  
Eighteenth Day of March, 2014

Michelle K. Lee  
*Deputy Director of the United States Patent and Trademark Office*